(12) United States Patent
Reiter et al.

(10) Patent No.: US 9,269,543 B2
(45) Date of Patent: Feb. 23, 2016

(54) COMPENSATION OF DEFECTIVE BEAMLETS IN A CHARGED-PARTICLE MULTI-BEAM EXPOSURE TOOL

(71) Applicant: IMS Nanofabrication AG, Vienna (AT)

(72) Inventors: Rafael Reiter, Vienna (AT); Elmar Platzgummer, Vienna (AT); Klaus Schiessel, Vienna (AT)

(73) Assignee: IMS NANOFABRICATION AG, Vienna (AT)

( * ) Notice: Subject to any disclaimer, the term of this patent is extended or adjusted under 35 U.S.C. 154(b) by 0 days.

(21) Appl. No.: 14/631,690

(22) Filed: Feb. 25, 2015

(65) Prior Publication Data

US 2015/0248993 A1    Sep. 3, 2015

(30) Foreign Application Priority Data

Feb. 28, 2014    (EP) .................................. 14157259

(51) Int. Cl.
*G21K 5/04*    (2006.01)
*H01J 37/317*    (2006.01)
*H01J 37/04*    (2006.01)

(52) U.S. Cl.
CPC ........... *H01J 37/3177* (2013.01); *H01J 37/045* (2013.01); *H01J 2237/0435* (2013.01); *H01J 2237/31715* (2013.01)

(58) Field of Classification Search
USPC .......... 250/396 R, 397, 492.1, 492.2, 492.21, 250/492.22, 492.23, 492.3
See application file for complete search history.

(56) References Cited

U.S. PATENT DOCUMENTS 1,033,741 A    7/1912    Sims
1,420,104 A    6/1922    Howe et al.
(Continued)

FOREIGN PATENT DOCUMENTS

CN    202204836 U    4/2012
EP    1033741 A2    9/2000
(Continued)

OTHER PUBLICATIONS

European Search Report for Application 09450211.9-1226, report dated Sep. 14, 2010, 4 pgs.
(Continued)

*Primary Examiner* — Nicole Ippolito
(74) *Attorney, Agent, or Firm* — KPPB LLP

(57) ABSTRACT

An exposure pattern is computed which is used for exposing a desired pattern on a target by means of a blanking aperture array in a particle-optical lithography apparatus which has a finite number of defects, said desired pattern being composed of a multitude of image elements within an image area on the target: A list of defective blanking apertures is provided, comprising information about the type of defect of the defective blanking apertures; from the desired pattern a nominal exposure pattern is calculated as a raster graphics over the image elements disregarding the defective blanking apertures; the "compromised" image elements (1105) are determined which are exposed by aperture images of defective blanking apertures; for each compromised element (1105), a set of neighboring image elements is selected as "correction elements" (1104); for each compromised element, corrected dose values are calculated for the correction elements, said corrected dose values minimizing an error functional of the deviation of the dose distribution including the defects from the nominal dose distribution, under the constraint that each of the corrected dose values falls within the allowed doses; and a corrected exposure pattern (1103) is generated by substituting the corrected dose values for the nominal dose values at the correction elements.

10 Claims, 10 Drawing Sheets

(56) References Cited

U.S. PATENT DOCUMENTS

| | | |
|---|---|---|
| 1,903,005 A | 3/1933 | Mccuen |
| 2,187,427 A | 1/1940 | Middleton |
| 2,820,109 A | 1/1958 | Dewitz |
| 2,920,104 A | 1/1960 | Brooks et al. |
| 3,949,265 A | 4/1976 | Holl |
| 4,467,211 A | 8/1984 | Smith et al. |
| 4,735,881 A | 4/1988 | Kobayashi et al. |
| 5,103,101 A | 4/1992 | Berglund et al. |
| 5,260,579 A | 11/1993 | Yasuda et al. |
| 5,369,282 A | 11/1994 | Arai et al. |
| 5,399,872 A | 3/1995 | Yasuda et al. |
| 5,814,423 A | 9/1998 | Maruyama et al. |
| 5,841,145 A | 11/1998 | Satoh et al. |
| 5,857,815 A | 1/1999 | Bailey et al. |
| 5,876,902 A | 3/1999 | Veneklasen |
| 5,933,211 A | 8/1999 | Nakasugi et al. |
| 6,014,200 A | 1/2000 | Sogard et al. |
| 6,043,496 A | 3/2000 | Tennant |
| 6,049,085 A | 4/2000 | Ema |
| 6,111,932 A | 8/2000 | Dinsmore |
| 6,137,113 A | 10/2000 | Muraki |
| 6,225,637 B1 | 5/2001 | Terashima et al. |
| 6,229,595 B1 | 5/2001 | McKinley et al. |
| 6,252,339 B1 | 6/2001 | Kendall |
| 6,280,798 B1 | 8/2001 | Ring et al. |
| 6,333,138 B1 | 12/2001 | Higashikawa et al. |
| 6,472,673 B1 | 10/2002 | Chalupka et al. |
| 6,473,237 B2 | 10/2002 | Mei |
| 6,552,353 B1 | 4/2003 | Muraki et al. |
| 6,767,125 B2 | 7/2004 | Midas et al. |
| 6,768,123 B2 | 7/2004 | Giering |
| 6,768,125 B2 | 7/2004 | Platzgummer et al. |
| 6,786,125 B2 | 9/2004 | Imai |
| 6,835,937 B1 | 12/2004 | Muraki et al. |
| 6,858,118 B2 | 2/2005 | Platzgummer et al. |
| 6,965,153 B1 | 11/2005 | Ono et al. |
| 7,084,411 B2 | 8/2006 | Lammer-Pachlinger et al. |
| 7,124,660 B2 | 10/2006 | Chiang |
| 7,129,024 B2 | 10/2006 | Ki |
| 7,199,373 B2 | 4/2007 | Stengl et al. |
| 7,201,213 B2 | 4/2007 | Leeson et al. |
| 7,214,951 B2 | 5/2007 | Stengl et al. |
| 7,276,714 B2 | 10/2007 | Platzgummer et al. |
| 7,459,247 B2 | 12/2008 | Bijnen et al. |
| 7,687,783 B2 | 3/2010 | Platzgummer et al. |
| 7,710,634 B2 | 5/2010 | Sandstrom |
| 7,714,298 B2 | 5/2010 | Platzgummer et al. |
| 7,777,201 B2 | 8/2010 | Fragner et al. |
| 7,781,748 B2 | 8/2010 | Platzgummer et al. |
| 7,823,081 B2 | 10/2010 | Sato et al. |
| 8,057,972 B2 | 11/2011 | Fragner et al. |
| 8,183,543 B2 | 5/2012 | Platzgummer et al. |
| 8,198,601 B2 | 6/2012 | Platzgummer et al. |
| 8,222,621 B2 | 7/2012 | Fragner et al. |
| 8,227,768 B2 | 7/2012 | Smick et al. |
| 8,294,117 B2 | 10/2012 | Kruit et al. |
| 8,304,749 B2 | 11/2012 | Platzgummer et al. |
| 8,378,320 B2 | 2/2013 | Platzgummer |
| 8,546,767 B2 | 10/2013 | Platzgummer et al. |
| 8,563,942 B2 | 10/2013 | Platzgummer |
| 9,053,906 B2 | 6/2015 | Platzgummer |
| 9,093,201 B2 | 7/2015 | Platzgummer et al. |
| 9,099,277 B2 | 8/2015 | Platzgummer |
| 2002/0021426 A1 | 2/2002 | Mei et al. |
| 2002/0148978 A1 | 10/2002 | Innes et al. |
| 2003/0085360 A1 | 5/2003 | Parker et al. |
| 2003/0106230 A1 | 6/2003 | Hennessey |
| 2003/0155534 A1 | 8/2003 | Platzgummer et al. |
| 2003/0160980 A1 | 8/2003 | Olsson et al. |
| 2004/0058536 A1 | 3/2004 | Ki |
| 2004/0119021 A1 | 6/2004 | Parker et al. |
| 2004/0157407 A1 | 8/2004 | Qin-Yi et al. |
| 2004/0169147 A1 | 9/2004 | Haruhito, et al. |
| 2005/0063510 A1 | 3/2005 | Hieronimi et al. |
| 2005/0104013 A1 | 5/2005 | Stengl et al. |
| 2005/0242302 A1 | 11/2005 | Platzgummer et al. |
| 2005/0242303 A1 | 11/2005 | Platzgummer |
| 2006/0060775 A1 | 3/2006 | Sakakibara et al. |
| 2006/0076509 A1 | 4/2006 | Okino et al. |
| 2006/0169925 A1 | 8/2006 | Miyajima et al. |
| 2007/0138374 A1 | 6/2007 | Nishibashi et al. |
| 2007/0178407 A1 | 8/2007 | Hatakeyama et al. |
| 2007/0279768 A1 | 12/2007 | Shibazaki et al. |
| 2008/0024745 A1 | 1/2008 | Baselmans et al. |
| 2008/0080782 A1 | 4/2008 | Olsson et al. |
| 2008/0099693 A1 | 5/2008 | Platzgummer et al. |
| 2008/0105827 A1 | 5/2008 | Tamamushi |
| 2008/0128638 A1* | 6/2008 | Doering et al. ............ 250/492.2 |
| 2008/0142728 A1 | 6/2008 | Smick et al. |
| 2008/0198352 A1 | 8/2008 | Kugler et al. |
| 2008/0203317 A1 | 8/2008 | Platzgummer et al. |
| 2008/0237460 A1 | 10/2008 | Fragner et al. |
| 2008/0257096 A1 | 10/2008 | Zhu et al. |
| 2008/0283767 A1 | 11/2008 | Platzgummer |
| 2008/0299490 A1 | 12/2008 | Takekoshi |
| 2009/0032700 A1 | 2/2009 | Park et al. |
| 2009/0101816 A1 | 4/2009 | Noji et al. |
| 2009/0256075 A1 | 10/2009 | Kemen et al. |
| 2009/0321631 A1 | 12/2009 | Smick et al. |
| 2010/0127185 A1* | 5/2010 | Fragner et al. ............. 250/398 |
| 2010/0178602 A1 | 7/2010 | Seto et al. |
| 2010/0187434 A1 | 7/2010 | Platzgummer et al. |
| 2010/0288938 A1 | 11/2010 | Platzgummer |
| 2011/0053087 A1 | 3/2011 | Nielsen et al. |
| 2011/0204253 A1 | 8/2011 | Platzgummer et al. |
| 2011/0226968 A1 | 9/2011 | Platzgummer |
| 2012/0076269 A1 | 3/2012 | Roberts et al. |
| 2012/0085940 A1 | 4/2012 | Matsumoto |
| 2012/0211674 A1 | 8/2012 | Kato |
| 2012/0286170 A1 | 11/2012 | Van De Peut et al. |
| 2013/0164684 A1 | 6/2013 | Yamanaka |
| 2013/0198697 A1* | 8/2013 | Hotzel ............................ 716/51 |
| 2013/0252145 A1 | 9/2013 | Matsumoto et al. |
| 2013/0253688 A1 | 9/2013 | Matsumoto et al. |
| 2014/0197327 A1 | 7/2014 | Platzgummer |
| 2015/0021493 A1 | 1/2015 | Platzgummer |
| 2015/0028230 A1 | 1/2015 | Platzgummer |
| 2015/0069260 A1 | 3/2015 | Platzgummer |
| 2015/0311030 A1 | 10/2015 | Platzgummer et al. |
| 2015/0311031 A1 | 10/2015 | Platzgummer et al. |

FOREIGN PATENT DOCUMENTS

| | | |
|---|---|---|
| EP | 2019415 A1 | 1/2009 |
| EP | 2187427 A2 | 5/2010 |
| EP | 2214194 A1 | 8/2010 |
| EP | 2317535 A2 | 5/2011 |
| EP | 2363875 A1 | 9/2011 |
| GB | 2349737 A | 11/2000 |
| JP | 08213301 A | 8/1996 |
| JP | 2006019436 A | 1/2006 |
| JP | 2006332289 | 12/2006 |
| WO | 2006084298 A1 | 8/2006 |
| WO | 2008053140 A1 | 5/2008 |
| WO | 2009147202 | 12/2009 |
| WO | 2012172913 A1 | 12/2012 |

OTHER PUBLICATIONS

European Search Report for application 09450212.7, report dated Sep. 28, 2010, 9 pgs.

European Search Report for Application 14165967, report dated Oct. 30, 2014, 2 pgs.

European Search Report for Application 14165970, report dated Jun. 18, 2014, 2 pgs.

European Search Report for Application 14170611, report dated Nov. 4, 2014, 3 pgs.

European Search Report for Application 14176563, report dated Jan. 14, 2015, 2 pgs.

European Search Report for Application 14177851, report dated Oct. 16, 2014, 1 page.

European Search Report for Application 14199183, report dated Jun. 19, 2015, 2 pgs.

(56) References Cited

OTHER PUBLICATIONS

European Search Report for Application 15164770, report dated Sep. 18, 2015, 2 pgs.
European Search Report for Application 15164772, report dated Sep. 11, 2015, 2 pgs.
European Search Report for Application 15169632, report dated Oct. 20, 2015, 3 pgs.
European Search Report for Application 15171348, report dated Oct. 30, 2015, 2 pgs.
European Search Report for Application 14176645, report dated Dec. 1, 2014, 1 pg.
European Search Report for Application 08450077.6, report dated Jan. 29, 2010.
European Search Report for Application 141501197.7, report dated Jun. 6, 2014, 2 pgs.
European Search Report for Application 10450070.7, report dated May 7, 2012, 2 pgs.
Berry et al., "Programmable aperture plate for maskless high-throughput nanolithography", J. Vac. Sci. Technol., Nov./Dec. 1997, vol. B15, No. 6, pp. 2382-2386.
Borodovsky, Yan, "EUV, EBDW—ARF Replacement or Extension?", KLA-Tencor Lithography User Forum, Feb. 21, 2010, San Jose, CA, USA.
Borodovsky, Yan, "MPProcessing for MPProcessors", SEMATECH Maskless Lithography and Multibeam Mask Writer Workshop, May 10, 2010, New York, NY, USA.
Disclosed Anonymously, "Multi-tone rasterization, dual pass scan, data path and cell based vector format", IPCOM000183472D, printed from ip.com PriorArtDatabase, published May 22, 2009, 108 pages.
Kapl et al.,"Characterization of CMOS programmable multi-beam blanking arrays as used for programmable multi-beam projection lithography and reisitless nanopatterning", Journal of Micromechanics and Microengineering, 21 (2001), pp. 1-8.
Li, H. Y. et al.,"Through-Silicon Interposer Technology for Heterogeneous Integration", Future Fab Intl., Issue 45 (Apr. 25, 2013).
Paraskevopoulos, A. et al., "Scalable (24-140 Gbps) optical data link, well adapted for future maskless lithography applications", Proc. SPIE vol. 7271, 72711 I (2009).
Platzgummer, Elmar et al., "eMET POC: Realization of a proof-of-concept 50 keV electron multibeam Mask Exposure Tool", Proc. of SPIE vol. 8166, 816622-1, 2011.
Platzgummer et al., "eMET—50keV electron Mask Exposure Tool Development based on proven multi-beam projection technology", Proc. of SPIE , vol. 7823, pp. 782308-1-782308-12.
Zhang et al.,"Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.

\* cited by examiner

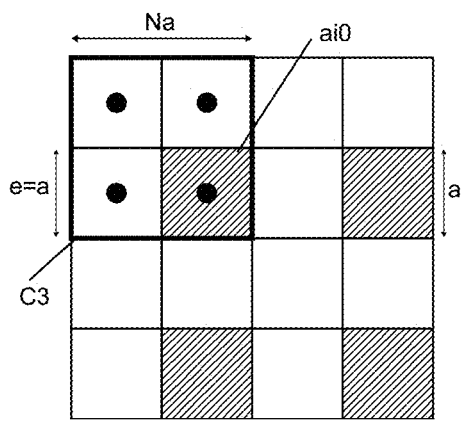 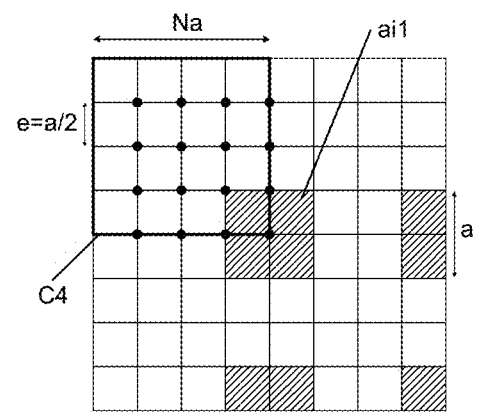
Fig. 6A                    Fig. 6B
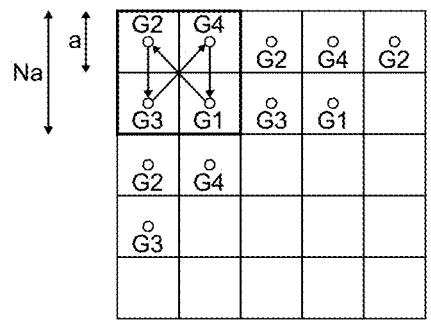
Fig. 7

COMPENSATION OF DEFECTIVE BEAMLETS IN A CHARGED-PARTICLE MULTI-BEAM EXPOSURE TOOL

RELATED APPLICATIONS

This application claims priority to European Patent Application 14157259.4 filed Feb. 29, 2014, the disclosure of which is incorporated herein by reference in its entirety

FIELD OF THE INVENTION

Embodiments of the present invention relates to a method for computing an exposing pattern for exposing a desired pattern on a surface of a target in a particle-beam exposure tool, as well as a method for forming a desired pattern on a surface of a target incorporating the computing method, designed to take into account certain defects that may be present in the exposure tool, that is, in the blanking aperture array used in the exposure tool to define the pattern.

In a specific application, embodiments of the invention is applied to a method for irradiating a target with a beam of energetic radiation formed by electrically charged particles, which comprises the steps of:

providing a pattern definition means having a plurality of apertures transparent to said radiation, illuminating said pattern definition means by means of an illuminating wide beam, which traverses the pattern definition means through said apertures, thus forming a patterned beam consisting of a corresponding plurality of beamlets, forming said patterned beam into a pattern image on the location of the target, with the pattern image comprising the images of at least part of the plurality of apertures covering a number of image elements on the target where the locations of the image elements corresponds to nominal (central) positions of aperture images, and generating a relative movement between said target and the pattern definition means producing a movement of said pattern image on the target along a path over a region where a beam exposure is to be performed, said region being composed of a plurality of image elements.

A charged-particle multi-beam processing apparatus suitable for performing the method according to many embodiments of the invention is disclosed in the U.S. Pat. No. 6,768,125 of the applicant, which is hereby incorporated into the present disclosure as relevant prior art. That document describes a charged-particle lithography and processing method and apparatus dubbed PML2 (short for "Projection Mask-Less Lithography"), and publications of the applicant describe eMET (short for "electron multi-beam Mask Exposure Tool"), both of which realize a multi-beam writing concept and use a programmable aperture plate system (APS) as a pattern definition (PD) device for structuring a particle beam, which is extracted from a single source of electrically charged particles. FIG. 1 shows a multi-beam processing apparatus of the eMET type with a PD device 102 in which beamlets are formed by means of apertures 20 in an aperture array plate 201 and pass through larger openings in a deflection array plate (DAP) 202; beamlets deflected in the DAP 202 are filtered out at a stopping plate 17 situated at or near the second cross-over c2 of charged-particle projection optics 103. This has the advantages that a terminal plate in the DAP is not needed, and a significantly smaller deflection angle will be sufficient to accomplish beam blanking in the DAP.

Charged-particle multi-beam lithography and processing is of high interest for nanolithography and nanopatterning applications, such as for multi-beam mask writing and for maskless multi-beam direct write processes on silicon wafer substrates. With regard to many embodiments of the present invention the terms "target" and "substrate" are used without difference in meaning.

In particular, electron multi-beam writing is a promising concept for the future industrial fabrication of photomasks as needed for 193 nm immersion lithography, of EUV-masks for extended ultra-violet lithography (EUVL), and of templates (1× masks) for nano-imprint lithography, in particular for sub-20 nm semiconductor technology nodes, with extendibility to sub-10 nm technology nodes. For the multi-beam mask writer the applicant has coined the acronym eMET (see above). Configurations of multi electron beam direct write (MEBDW) processing on silicon wafers in multi-column PML2 configurations are described in U.S. Pat. No. 7,214,951 and U.S. Pat. No. 8,183,543 of the applicant.

The PD device is, preferably, a programmable multi-aperture device. The implementation of a charged-particle multi-beam projection optical system based on a programmable multi-aperture plate allows a significant improvement of the achievable productivity in comparison with focused single spot beam systems as well as variable shaped beam (VSB) systems. The reasons for the improved productivity are, first, the parallelism of the process using a plurality of beams and, second, the increased current (of all beamlets writing in parallel) which can be imaged to a substrate at the same resolution. As compared with a single electron beam system, the current density at target of the electron multi-beam writing apparatus (in the order of $A/cm^2$) is lower by approx. two orders of magnitude when compared to VSB systems, thus reducing instantaneous heating effects which are unavoidable when using single beam systems with high ($>100$ $A/cm^2$) current density.

The layout data is usually generated in polygonal structures. For the exposure of resist images by means of a maskless pattern writing tool the layout data is converted into pixel image data (rasterization). Therefore, the technology for maskless tools requires specific methods for data preparation. One feature of the maskless tool concept is that each pixel requires the same amount of time regardless of whether it is exposed or not.

The number of pixels required to obtain a sufficiently good feature resolution at standard chip sizes is quite high and remains a challenging task. Therefore, the storage of the complete rasterized image data is not feasible. Instead, the layout data are processed in an online rasterization which employ simple algorithms, which take only short runtime. The PML2 and eMET multi-beam direct write concepts allow for a large enhancement of the writing speed compared to single beam writers. This arises from the reduction of the required current density, the diminished importance of space charge due to the large cross section, the enhanced data transfer rate due to the parallel writing strategy, and the high degree of redundancy possible using a plurality of beams.

The document U.S. Pat. No. 7,276,714 of the applicant discloses a pattern definition means for particle beam processing, comprising at least an aperture plate and blanking means. The apertures in the aperture plate are arranged in "interlocking grids", wherein the apertures are arranged in groups in squares or rectangles whose basic grids are offset to each other.

This means that the positions of the apertures taken with respect to a direction perpendicular to a scanning direction and/or parallel to it are offset to each other by not only multiple integers of the effective width of an aperture, as taken along said direction, but also by multiple integers of an integer fraction of said effective width. In this context, "scanning direction" denotes the main direction along which the image of the apertures formed by the charged-particle beam on a target surface is moved over the target surface during an exposure process.

The "interlocking grids"-solution in combination with dose control on the pixel exposed allows a finer resolution for positioning of structures or patterns on the target surface even though the individual spots formed by each image of an individual aperture are not decreased in size. Particular values of the fractional offsets are integer multiples of $\frac{1}{2}^K$ times the effective width of an aperture, where K is a positive integer. As a consequence, the writing or placement grid for the pixels exposed may be finer than necessary for fully covering a target area (oversampling).

Furthermore, U.S. Pat. No. 7,276,714 describes the generation of gray scales by subsequent exposures of one pixel on the target by multiple apertures located in line. Thus, a shift register approach can be effectively applied to create gray scale patterns, i.e. exposure levels interpolated between a minimal and maximal ('black and white') exposure dose.

The state-of-the-art PML2 concept is a strategy where the substrate is moved continuously, and the projected image of a structured beam generates all gray pixels by subsequent exposures of apertures located in line. To realize gray levels, the total amount of apertures in a line may be subdivided into groups, the number of groups corresponding to the number of desired gray levels. In a recent variant described in the U.S. Pat. No. 7,777,201 by the applicant, a so called "trotting mode" writing strategy is proposed in which for each pixel one or a few beams along the (mechanical) scanning direction are used to generate the entire set of the gray pixels. In U.S. Pat. No. 8,222,621 by the applicant gray pixels are realized by controlling the exposure time of the aperture image to be exposed. Here, only a single exposed aperture image is needed to generate one gray pixel, thus further reducing CMOS and data management complexity. At the same time, the PD device is simplified to arrange apertures according to a regular rectangular grid, while the space between the aperture images is reached by deflecting the images to the placement grids as needed. The temporal sequence of moving the aperture images over the placement grids, the placement grid sequence, may be chosen freely.

Within this disclosure, the term "image element"—abbreviated as IEL—is used to denote an exposure dose on the target within the pattern area resulting from imaging of an aperture at some exposure interval, in accordance with the current placement grid. Thus, an IEL is largely the same as a pixel on the target. Due to the imaging properties of the projection system, an IEL will usually have a finite overlap with its neighboring IEL.

A common problem to be solved is that the PD device is generally non-ideal, which means that a (small) number of the apertures will not work as designed. A faulty aperture may be physically blocked (thus being always closed), it may be unable to be switched (thus being always open) or may transmit a beamlet towards an incorrect position on the target (e.g., a position error). As a general remedy the corresponding aperture will be switched off, whenever this is possible. For a given PD system, the location of such defective apertures can be determined.

Due to the freedom of choosing a placement grid sequence, it is possible to ensure that an IEL which includes the aperture image written by a defective aperture is always surrounded by IELs written by other, non-defective apertures.

The interlocking grid approach already lowers the significance of an aperture error because in the image exposed every IEL overlaps with IELs produced by multiple other, non-defective apertures, and the significance of a single aperture image is thus lowered. In many cases, in particular if the image of the defective aperture occurs distant from a Dose-To-Clear (DTC) contour line, this correction strategy is sufficient. However, it is not if the defective aperture image is located directly at or in the vicinity of a DTC line, since a significant perturbation of the DTC line may arise, calling for more elaborate correction methods previously not available.

SUMMARY OF THE INVENTION

The objective of many embodiments of present invention is to correct the error in the DTC line introduced by defective apertures. In this context, "defective aperture" refers to an aperture with a fixed exposure level, e.g. 100% (always-on error), 0% (always-off error) or any other exposure level which will produce an exposure different from the programmed level for the IELs ("defective IELs") where the defective aperture is imaged.

The defective aperture correction (DAC) modifies the exposure level of the IELs in the near vicinity of the defective IEL (called correction IELs in the following) so that the impact of the defective IEL on the global dose distribution is minimized. This lowers the error significantly. It is made possible by the overlap of the IEL, which depends on the dose distribution of the individual IEL and the oversampling.

After the creation of the rasterized image data, the defective apertures are associated with their IELs. For each of those defective IELs, the DAC process is executed, and in turn, the rasterized image data is modified for the correction IELs.

The task is formulated as an optimization problem which is solved for every single defective IEL. This is necessary because the exposure level of the correction IELs is already set by the rasterization process and the upper and lower limits of possible exposure levels only allow a certain change of the level. The possible minimum and maximum change of the exposure level of each correction IEL is different for every defective IEL because it depends on the rasterized image in the vicinity of the defective IEL.

The goal of the optimization algorithm is the minimization of the difference between the ideal dose distribution, given by the sum of all IELs, and the corrected dose distribution, given by the sum of the defective IEL, the correction IELs and all other IELs. The correction of the DTC line position is contained in that minimization. As a consequence, the DAC does not use the initial vector geometry, but only the rasterized image data. The complexity of the vector geometry is irrelevant to the performance of the correction, and also, the DAC is independent of the concrete implementation of the rasterization algorithm, which has significant degrees of freedom.

In certain situations, it becomes necessary to use not only the IELs directly next to the defective IEL as correction IELs, but also more distant IELs. This dramatically increases the correction quality if the direct neighbor IELs are already at or near their minimum or maximum exposure level. The algorithm chooses the specific correction IELs according to the "availability" of potential changes of exposure levels. The chosen set of potential correction IELs significantly influences the runtime of the correction, ie. the runtime increases with the number of potential correction IELs as well as the quality of the resulting correction.

The correction is computed faster than the writing process by orders of magnitude and is implemented as a real-time correction. This is necessary because the data to be corrected is generated and processed further in real-time and is reached by formulating the optimization problem as a linear problem and, in turn, in the form of low-dimensional linear algebra operations. It has been implemented, e.g., on an NVIDIA GPU directly after the rasterization on the same machine and does not require additional hardware compared to the rasterization process. The core optimization algorithm is a modified and optimized version of the Lawson-Hanson NNLS algorithm which can handle not only non-negative, but also box constraints. The algorithm working data are small enough to fit into the processor registers. The memory is only accessed for reading the defective beamlet and writing the correction beamlet coefficients.

Because of the real-time nature of the DAC, system parameters (e.g., the set of defective apertures or the writing sequence) can be changed at any time. The possibility to switch off apertures at will enables the method to handle an aperture error of any nature (not restricted to always-on and always-off errors): an aperture with a general defect can be switched off by the user and will be handled as an always-off error.

The dose distribution (point spread function) of the individual IELs is an input value because it contributes to the overlap between the IELs. It is possible to handle varying point spread functions, i.e., having spatial variation across the aperture plate.

The algorithm is specifically designed to work with a multi-beam writer with interlocking because of its real-time capability and the underlying finite overlap of the IELs.

An always-on aperture exposes the material even outside the "exposure time" window. This introduces an asymmetry between always-on and always-off errors.

In other words, many embodiments of the invention proposes a method for computing an exposure pattern for exposing a desired pattern on a target by means of a blanking aperture array in a particle-optical lithography apparatus taking into account a finite number of defects in said blanking aperture array, said desired pattern being composed of a multitude of image elements within an image area on the target, wherein the blanking aperture array comprises a plurality of blanking apertures arranged within a blanking array area in a predetermined arrangement defining mutual positions of the blanking apertures, each blanking aperture being selectively adjustable with regard to a dose value to be exposed through the respective blanking aperture onto a corresponding aperture image on the target during a respective exposure interval, said dose value taking a value within a common dose interval between a minimum value and a maximum value, with the exception of a finite number of defective blanking apertures, each defective blanking aperture exposing either a respective constant dose value or a dose interval incompatible with the common dose interval onto a corresponding aperture image on the target during an exposure interval, wherein during a writing process, a sequence of exposure intervals is made, wherein in each exposure interval the blanking apertures are imaged onto the target, thus generating a corresponding plurality of aperture images, wherein the position of aperture images is kept fixed relative to the target during an exposure interval and coincides with the position of an image element, but between exposure intervals the position of aperture images is shifted over the target, thus exposing a plurality of aperture images so as to cover all image elements within said image area on the target, (it is remarked that, in general, multiple aperture images will contribute to one image element)

wherein the method comprises:
(a) providing a list of defective blanking apertures, said list comprising information for each defective blanking aperture listed therein, specifying position and either constant dose value or incompatible dose interval of the respective defective blanking aperture,
(b) providing the desired pattern and calculating a nominal exposure pattern as a raster graphics defined on the multitude of image elements disregarding the defective blanking apertures, said nominal exposure pattern being suitable to create a nominal dose distribution on the target realizing contour lines of the desired pattern and including for each image element thereof a respective nominal dose value,
(c) determining image elements which are exposed by aperture images of defective blanking apertures (referred to as "compromised elements"),
(d) selecting, for each compromised element, a set of image elements (referred to as "correction elements"), said correction elements being located within a neighborhood of, but different from, the respective compromised element within the image area on the target,
(e) calculating, for each compromised element, corrected dose values for the correction elements, said corrected dose values minimizing an error functional of the deviation of the nominal dose distribution from a dose distribution on the target calculated with said corrected dose values, under the constraint that each of the corrected dose values fall within the common dose interval;
(f) generating, from the nominal exposure pattern, a corrected exposure pattern suitable to expose the desired pattern by said writing process by substituting the corrected dose values for the nominal dose values at the respective correction elements.

By virtue of this solution, the above described goals are achieved in a surprisingly efficient manner. Further advantages are discussed below in the detailed description of the invention.

In order to reduce the amount of calculations in the method according to many embodiments of the invention, it is advantageous in step (e) to use pre-calculated coefficients which are uniform for all compromised elements. In particular, there is a first group of pre-calculated coefficients (vector b, see below) which each represent the integrated overlap between a compromised element and a respective correction element of the pertinent set of correction elements, and a second group of pre-calculated coefficients (matrix S), each describing the integrated mutual overlap between two correction elements within a set of correction elements.

The neighborhood mentioned in step (d) is always a finite range around the location of the respective compromised element. In particular, in step (d) the correction elements may be chosen from the set of nearest neighbors to the respective compromised element, or the set of neighbors to the respective compromised element up to a predetermined maximum distance; where the distance is measured using a suitable distance function, such as Euclidean, rectilinear or p-norm distance.

As an additional measure for compensating an always-on defect, it may be advantageous for defective elements caused by a defective blanking aperture having a defect where the defective blanking aperture exposes a respective constant value (i.e., always-on defect), that before step (e) the respective dose value is additionally increased by multiplication with a factor corresponding to the quotient of the duration of one exposure interval to the duration during which an aperture image remains positioned on an image element.

Other types of defects will require different approach for compensation. For instance, for defective elements caused by a defective blanking aperture having a defect different from a defect where the defective blanking aperture exposes either a respective constant dose value or a dose interval incompatible with the common dose interval, it may be suitable to treat the defect as always-off defect, and the respective blanking aperture is then operated at the minimum value of the dose interval.

As one example of a suitable implementation of the error function in step (e), there is a least-squares error functional of the deviation, and calculating corrected dose values may then comprise solving for a minimum of said error function using a box-constrained least-squares algorithm. Typically and preferably the dimensionality will be equal to the number of correction elements within the respective set. It may be noteworthy to point out that generally, not only the corrected dose values of the correction element, but also the modified dose values of the compromised elements (by virtue of the overlap with the pertinent correction elements) will enter into the error functional.

In order to simplify the procedure it is often of advantage to perform step (d) using a uniform geometry of the set of correction elements relative to the position of the respective compromised element.

In a further aspect, one suitable approach to compensate relative-dose defects, which causes the exposure of a dose value which differs from the value assigned to the respective blanking aperture by a multiplicative factor individual to the blanking aperture, may be as follows: For defective elements caused by a defective blanking aperture having such a relative-dose defect, before step (e) the dose values of the defective blanking aperture are multiplied with the inverse of said constant factor, and if the dose value thus obtained exceeds the maximal value of the common dose interval, the respective defective blanking aperture is treated as having an always-on defect.

In another development in many embodiments of the invention a placement grid approach is used, wherein between exposure intervals the position of aperture images is shifted over the target according to a placement grid sequence. In this case, it may be suitable that in step (d) a placement grid sequence is selected with regard to a geometry of the set of correction elements relative to the position of the respective compromised element, where said placement grid sequence and said geometry ensure that for any compromised element the respective set does not include image elements exposed by a defective blanking aperture.

Many embodiments of the invention also include a method for exposing a desired pattern on a target by means of a blanking aperture array in a particle-optical lithography apparatus taking into account a finite number of defects in said blanking aperture array, said desired pattern being composed of a multitude of image elements within an image area on the target, wherein the blanking aperture array is illuminated with a beam of electrically charged particles, the blanking aperture array comprising a plurality of blanking apertures arranged within a blanking array area in a predetermined arrangement defining mutual positions of the blanking apertures, and images of at least part of said blanking apertures are imaged onto the image area on the target, wherein each blanking aperture is selectively adjustable with regard to a dose value to be exposed through the respective blanking aperture onto a corresponding aperture image on the target during a respective exposure interval, said dose value taking a value within a common dose interval between a minimum value and a maximum value, with the exception of a finite number of defective blanking apertures, each defective blanking aperture exposing a respective constant dose value onto a corresponding aperture image on the target during an exposure interval, wherein during a writing process, a sequence of exposure intervals is made, wherein in each exposure interval the blanking apertures are imaged onto the target, thus generating a corresponding plurality of aperture images, wherein the position of aperture images is kept fixed relative to the target during an exposure interval and coincides with the position of an image element, but between exposure intervals the position of aperture images is shifted over the target, thus exposing a plurality of aperture images so as to cover all image elements within said image area on the target, wherein the exposure pattern for exposing the desired pattern on the target by said writing process, said exposure pattern comprising the dose values for the blanking apertures for each exposure interval, is computed by the method according to many embodiments of the invention.

In the following, the embodiments of the invention and further developments are described and illustrated with an example of an embodiment based on a PML2/eMET setup and the attached drawings. It is understood, however, that embodiments of the invention are not limited to the specific example described hereinafter.

BRIEF DESCRIPTION OF THE DRAWINGS

FIG. 6A shows a further arrangement of apertures with $M_x=2, M_y=2, N_x=2, N_y=2$;

FIG. 6B shows an example of a pixel placement grid that is finer than the size of the image of an aperture (oversampling) in comparison to FIG. 5A;

FIG. 7 shows an example of placement grids;

DETAILED DESCRIPTION OF THE INVENTION

One embodiment of the invention discussed in the following is a development from the particle-beam exposure apparatus of PML2 and eMET type with a pattern definition (PD) system as disclosed in U.S. Pat. No. 6,768,125 and U.S. Pat. No. 7,781,748 of the applicant, and with a large-reduction projecting system. In the following, first the technical background of the apparatus is discussed—as far as relevant to many embodiments of the invention—, then certain embodiments of the invention are presented in detail.

It should be appreciated that the invention is not restricted to the following embodiments or the particular layout of the PD system, which merely represent one of the possible applications of the invention; embodiments of the invention are suitable for other types of processing systems that use a multi-beam setup for exposure of a target.

Charged-Particle Multi-Beam System

Figure 1:
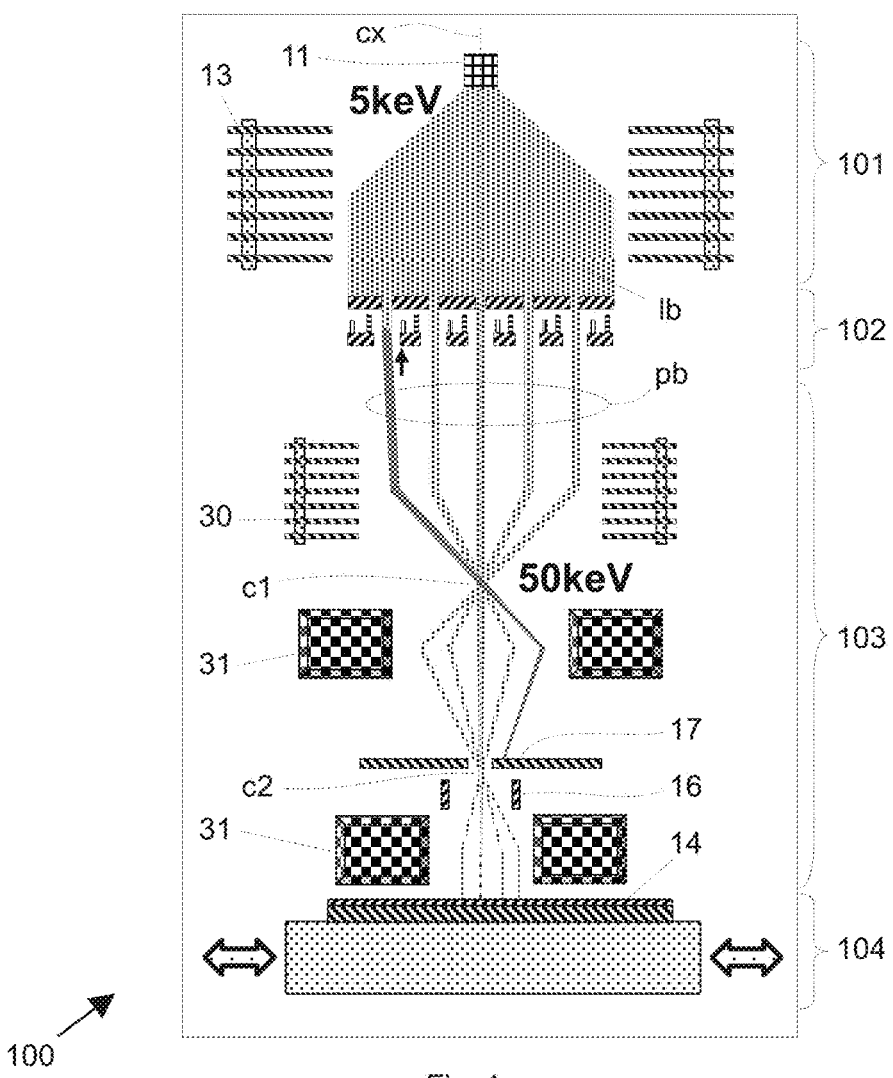
FIG. 1 is an overview of a particle-beam exposure apparatus suitable for certain embodiments of the invention in a longitudinal section.

A schematic overview of an charged-particle multi-beam mask exposure tool (mask writer) employing embodiments of the invention is shown in FIG. 1. In the following, only those details are given as needed to disclose the certain embodiments of the invention such that one of ordinary skill in the art can practice the respective embodiments; invention; for the sake of clarity, the components are not shown to size in FIG. 1, particularly the lateral width of the particle beam is exaggerated. Similar to eMET are also the principles of the PML2 system; for more details, the reader is referred to the U.S. Pat. No. 6,768,125 and U.S. Pat. No. 7,781,748, whose teachings with respect to the overall layout of the particle-beam apparatus and the PD means are herewith included by reference.

A source suitable for generating an electron beam is used in the eMET system. In a variant, the beam could be realized with other electrically charged particles, in particular ions of positive charge, using an suitable ion source. A particle-optical illumination system forms the beam into a wide beam which illuminates a PD device having a regular array of apertures in order to define a beam pattern to be projected on a target surface. With each aperture, a small beam (also referred to as 'beamlet') is defined, and the passage of each beamlet through an aperture can be controlled so as to allow ('switch on') or effectively deactivate ('switch off') the passage of particles of the beam through the apertures and/or subsequent demagnifying charged-particle projection optics towards the target. The beamlets traversing the aperture array form a patterned particle beam as represented by the spatial arrangement of the apertures and including information of on-off definitions for the individual beamlets. The patterned beam is then projected by means of a demagnifying charged-particle optical projection system onto the target (for instance, a mask blank or a semiconductor wafer substrate) where an image of those apertures whose corresponding beams are not deflected is thus formed to expose or to modify the target at the irradiated portions. The images formed by the beamlets projected to the substrate form a "pattern image", which is exposed along a straight path ("stripe") on the substrate mechanically moving in one direction; the (large-scale) motion of the substrate is usually achieved by a continuous motion of the target stage, possibly with fine adjustment of the projection system at the same time. The direction of movement of the image relative to the stage is also dubbed (main) scanning direction. An additional scanning of the beam in a direction perpendicular to the main scanning direction is done only within a small lateral range, for instance to compensate for lateral travel motion errors of the scanning stage and/or to include a (limited) number of parallel pixel rows, as explained more in detail below with reference to FIG. 5, as well as in the U.S. Pat. No. 8,222,621 of the applicant, which document is herewith included by reference.

The main components of the apparatus 100 are—in the order of the direction of the beam Ib, pb which in this example runs vertically downward in FIG. 1—an illumination system 101, a PD system 102, a projecting system 103, and a target station 104 with the target or substrate 14. The charged-particle optical systems 101, 103 are realized using electrostatic and/or electromagnetic lenses. The charged-particle optical parts 101,102,103 of the apparatus 100 are contained in a vacuum housing (not shown) held at high vacuum to ensure an unimpeded propagation of the beam Ib, pb along the optical axis of the apparatus.

The illumination system 101 comprises, for instance, an electron or ion source 11, an extractor arrangement defining the location of the virtual source, a general blanker 12 (not shown in FIG. 1), which in the case of using ion beams may also be used as particle filter, and an illumination charged-particle optics realized by a particle optical condenser lens system 13. In the embodiment shown the particle source 11 emits energetic electrons of a suitable kinetic energy such as, e.g., 5 keV; in other implementations, other electrically charged particles such as ions of primarily a certain species may be used, such as hydrogen or Ar+ ions having a defined (kinetic) energy of typically several keV (e.g. 5 keV at the PD system 102) with a comparatively small energy spread of, e.g., $\Delta E=1$ eV. A velocity/energy dependent filter (not shown) may be provided to filter out other, unwanted particle species that may also be produced in the source 11; the filter may also be used to blank out the beam as a whole during repositioning of the beamlets. By means of the condenser lens system 13, the charged particles emitted from the source 11 are formed into a wide-area, substantially telecentric beam ("illuminating beam") lb.

The beam Ib then irradiates a blanking device which, together with the devices needed to keep its position (not shown), forms the PD device 102 (which is also shown in a schematic perspective detail view at the left-hand side of FIG. 1). The PD device is held at a specific position in the path of the beam Ib, which thus irradiates an aperture array pattern formed by a plurality of apertures 20. As already mentioned, each of the apertures can be "switched on" or "off". In a "switched on" or "open" state, an aperture allows the beamlet passing through the respective aperture to reach the target; it is then said, the aperture is transparent to the incident beam. Otherwise, the aperture is "switched off" or "closed", in which case the beam path of the respective beamlet is affected (e.g. by means of deflecting electrodes to which a transverse voltage is applied) in a way that it will be absorbed or otherwise removed out of the beam path before it can reach the target; thus, the aperture is effectively non-transparent or opaque to the beam. The pattern of switched-on apertures is chosen according to the pattern to be exposed on the substrate, as these apertures are the only portions of the PD device transparent to the beam Ib, which is thus formed into a patterned beam pb emerging from the apertures (i.e., in FIG. 1, below the PD system 102). The architecture and operation of the PD device, in particular with regard to its blanking plate, is discussed in detail below. In FIG. 1 only five beamlets are shown in the patterned beam pb, while it will be clear that the actual number of beamlets is very large, i.e. typically many thousands or even in the order of millions; of the beamlets shown, the first from the left is depicted switched off as it is deflected within the PD device 102 and absorbed on a stopping plate 17, which is situated at or near the second cross-over c2 of the charged particle projection optics; the other beamlets, which are switched-on, pass through a central opening of the plate 17 and thus are projected onto the target The pattern as represented by the patterned beam pb is then projected by means of a charged-particle optical projection system 103 towards the substrate 14 (such as a 6" mask blank with resist coating); since the beamlets which are switched off are absorbed at the stopping plate 17, only the switched-on beamlets will form an image of the switched-on apertures. The projection system 103 implements a demagnification of, for instance, 200:1, as realized by the applicant. The substrate 14 may be, for instance, in the case of an eMET-type system a 6-inch mask blank or a nanoimprint 1× mask or master template, covered with an resist layer, whereas for a PML2 system the substrate 14 may be a silicon wafer covered with a particle sensitive resist layer. The substrate 14 is held and positioned by a substrate stage (not shown) of the target station 104.

The projection system 103 is, for instance, composed of two consecutive charged-particle optical projector sections with a crossover c1 and c2, respectively. The particle-optical lenses 30, 31 (comprising, for instance, an electrostatic multi-electrode accelerating lens 30 and two magnetic lenses 31) used to realize the projectors are shown in FIG. 1 in symbolic form only as technical realizations of electrostatic imaging systems are well known in the prior art; in other embodiments of the invention, also magnetic and/or electromagnetic lenses may be included as suitable. The first projector section images the plane of the apertures of the PD device to an intermediate image which in turn is imaged onto the substrate surface by means of the second projector section. Both sections employ a demagnifying imaging through crossovers c1,c2; thus, while the intermediate image is inverted, the final image produced on the substrate is upright (non-inverted). The demagnification factor is about 14:1 for both stages, resulting in an overall demagnification of 200:1. A demagnification of this order is in particular suitable with a lithography setup, in order to elevate problems of miniaturization in the PD device. The charged-particle optical lenses are mainly composed of electrostatic electrodes, but magnetic lenses may also be used.

Further details of the charged-particle optical system can be found in the above-cited prior art.

As a means to introduce a small lateral shift to the image, i.e. along a direction perpendicular to the optical axis cx, deflection means 16 are provided in one or both of the projector sections. Such deflection means can be realized as, for instance, a multipole electrode system, as discussed in the U.S. Pat. No. 6,768,125. Additionally, an axial magnetic coil may be used to generate a rotation of the pattern in the substrate plane where needed. The lateral deflections are usually quite small in comparison to the lateral width of the patterned beam by itself, in most cases in the order of a few widths of a single beamlet or the distance between neighboring beamlets, but still at least one order of magnitudes below the beam width (it should be appreciated in this context that the lateral distance between beamlets is considerably smaller than the entire width of the beam bp).

By virtue of the pattern formed in the PD device 102, an arbitrary beam pattern can be generated and transferred to a substrate.

Figure 2:
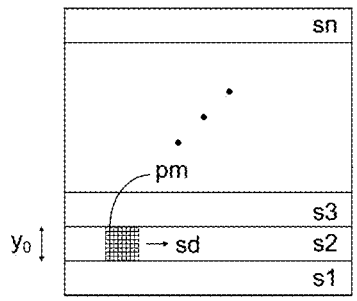
FIG. 2 illustrates the basic writing strategy on the target using stripes.

Referring to FIG. 2, a pattern image pm as defined by the PD system 102 is produced on the target 14, which may, for instance, be as a resist-covered wafer. The wafer surface will comprise one or more areas r1 to be exposed. Generally, the pattern image pm exposed on the target has a finite size y0 which is usually well smaller than the width of the area r1 which is to be patterned. Therefore, a scanning stripe exposure strategy is utilized, where the target is moved under the incident beam, so as to change the position of the beam on the target perpetually: the beam is effectively scanned over the target surface. In the embodiment shown, it is the target which effects the (large-scale) movement, so a beam-scanning strategy is not required for the large-scale movement; it is emphasized that for the purpose of many embodiments of the invention, only the relative motion of the pattern image pm on the target is relevant.

The relative movement of target and beam is realized such that the pattern image pm is moved over the area r1 so as to form a sequence of stripes s1, s2, s3, . . . sn (exposure stripes). The width of each stripe corresponds to the width y0 of the pattern image pm perpendicular to the scanning direction sd. The complete set of stripes covers the total area of the substrate surface. The scanning direction sd may alternate from one stripe to the next, but in the embodiment shown the scanning direction is the same for all stripes, for instance from the left to the right in FIG. 2 (which is generated by a corresponding motion of the target to the left), with a quick repositioning of the image from the end of one stripe to the start of the next stripe (at the right). The repositioning between stripes will generally be done using a common blank-out of the beam as described in U.S. Pat. No. 7,781,748 of the applicant.

It will be clear from the above that the pattern image pm is composed of a plurality of pattern pixels px. It should be appreciated, however, that only a subset of the pixels px can be exposed simultaneously since only a finite number of apertures is present in the aperture field of the PD system. The pixels which can be exposed simultaneously are hereinafter referred to as primary pixels p1 (see FIG. 3, which shows only one possible spatial arrangements of primary pixels). It will be appreciated that the primary pixels p1 reproduce the spatial arrangement of the apertures 20 in the aperture means 202 of the PD system 102, though at a different scale (because of the demagnification of the optical system). In the simple case of no oversampling (as shown in FIGS. 2 and 5A), the images of the apertures correspond to the primary pixels p1 one-to-one; generally, however, a pixel refers to the location of the center of an aperture image in a possibly finer placement grid so that an aperture image may cover an area larger than the area of a pixel. In a sequence of consecutive pixel exposure cycles, the pattern image pm is swept over the target (which is achieved by a movement of the target, a movement of the beam, or a proper combination of both) so as to expose all pixels px on the target in successive way.

Figure 1A:
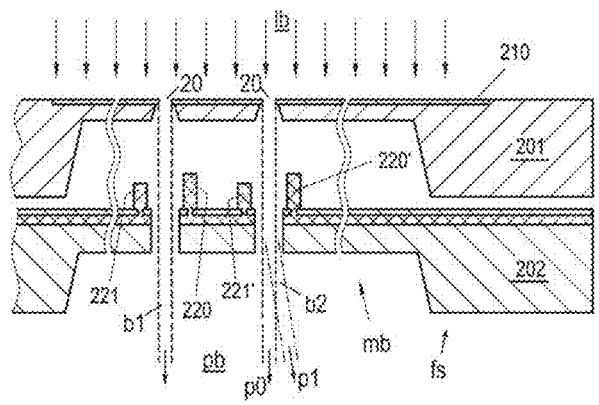
FIG. 1A shows a PD device used in the apparatus of FIG. 1 in a sectional view detail.

FIG. 1A shows a PD device 102 in a detail sectional view with one aperture array plate 201 and one deflection array plate (DAP) 202, which is basically in conformance with U.S. Pat. No. 6,768,125 and U.S. Pat. No. 7,276,714 of the applicant. The illuminating beam Ib traverses the plates 201, 202 through an array of apertures 20 (equivalent to apertures ap of FIG. 3). The PD system 102 comprises a number of plates 201, 202 which are mounted in a stacked configuration, realizing a composite device whose components serve respective specific functions. Each of the plates is preferably realized with silicon microsystems technology in which the structures have been formed by micro-structuring techniques as outlined e.g. in U.S. Pat. No. 7,687,783 and U.S. Pat. No. 8,198,601. Other possible regular arrangements of the apertures in the PD system are a rectangular arrangement or an arrangement of staggered lines as described in U.S. Pat. No. 6,768,125.

FIG. 1A shows a PD device 102 in a detail sectional view with one aperture array plate 201 and one deflection array plate (DAP) 202, which is basically in conformance with U.S. Pat. No. 6,768,125 and U.S. Pat. No. 7,276,714 of the applicant. The illuminating beam lb traverses the plates 201, 202 through an array of apertures 20 (equivalent to apertures ap of FIG. 3). The PD system 102 comprises a number of plates 201, 202 which are mounted in a stacked configuration, realizing a composite device whose components serve respective specific functions. Each of the plates is preferably realized with silicon microsystems technology in which the structures have been formed by micro-structuring techniques as outlined e.g. in U.S. Pat. No. 7,687,783 and U.S. Pat. No. 8,198,601. Other possible regular arrangements of the apertures in the PD system are a rectangular arrangement or an arrangement of staggered lines as described in U.S. Pat. No. 6,768,125.

Following the aperture array plate 201 downstream, a deflector array plate 202 (DAP; also referred to as blanking plate in view of its function in the context of the apparatus 100) is provided. This plate serves to deflect selected beamlets and thus to alter their beam path. The DAP has a plurality of so called blanking openings, which each correspond to a respective aperture of the aperture array plate 201. As mentioned above and shown in FIGS. 1 and 1A, the blanking openings in the DAP are larger than the openings in the aperture array plate.

Each blanking opening in the DAP is provided with a beamlet deflection means formed by electrodes 220, 221, 220', 221', which allows to individually deflect charged particles transgressing through the opening, thus diverting the beamlet traversing the opening off its path. For instance, beamlet b1 transgresses the subsequent larger opening of the pattern definition system 102 without being deflected, since the beamlet deflection means formed by the respective set of beamlet deflection electrodes is not energized, meaning here that no voltage is applied between the active electrode 221 and the associated ground electrode 220. This corresponds to the "switched-on" state of the aperture. Beamlet b1 passes the pattern definition system 102 unaffected and is focused by the particle-optical system through the crossovers and imaged onto the target with a reduction as induced by the charged-particle projection optics. For example, in systems implemented by the applicant, a reduction factor as large as 200:1 was realized. In contrast, as shown with beamlet b2, a "switched-off" state is realized by energizing the beamlet deflection means of this aperture, i.e. applying a voltage to the active electrode 221' with regard to the corresponding ground electrode. In this state, the beamlet deflection means formed by electrodes 220',221' generates a local electric field across the path of the corresponding beamlet b2 and thus deflects the beamlet b2 off its normal path p0 to a deflected direction. As a consequence the beamlet will, on its way through the charged-particle optical system, obey an altered path p1 and be absorbed at an absorbing means provided in the optical system, rather than reaching the target. Thus, beamlet b2 is blanked. The beam deflection angle is largely exaggerated in FIG. 1; it is, in general, very small, typically 0.2 to 1 thousands of a radian.

The pattern of switched-on apertures is chosen according to the pattern to be exposed on the substrate. Thus, in an actual pattern not all pixels are exposed at the full dose, but some pixels will be "switched off" in accordance with the actual pattern; for any pixel (or, equivalently, for every beamlet covering the pixel) the exposure dose can vary from one pixel exposure cycle to the next whether the pixel is "switched on" or "switched off", depending on the pattern to be exposed or structured on the target.

Gray Shades or Exposure Dose Levels

While the substrate 14 is moved continuously, the same pattern pixel px on the target may be covered many times by the images of a sequence of apertures during the same scanning movement. Simultaneously, the pattern in the PD system is shifted, step by step, through the apertures of the PD system. Thus, considering one pixel at some location on the target, if all apertures are switched on when they cover that pixel, this will result in the maximum exposure dose level: a "white" shade corresponding to 100%. In addition to a "white" shade, it is possible to expose a pixel at the target according to a lower dose level (also dubbed 'gray shade') which would interpolate between a the minimal ('black') and maximal ('white') exposure dose levels. A gray shade may, for instance, be realized by switching on only a subset of apertures that may be involved in writing one pixel; for example, 8 out of 32 apertures would give a gray level of 25%. A more recent, and in the context of many embodiments of the present invention advantageous, approach is to reduce the duration of unblanked exposure for the apertures involved. Thus, the signal controlling the exposure duration of one aperture image is modulated by a gray scale code, for example an integer number coded as a binary number of n bits. Thus, the exposed aperture image may show one of a given numbers of gray shades that correspond to zero and the maximum exposure duration and dose level.

Figure 4:
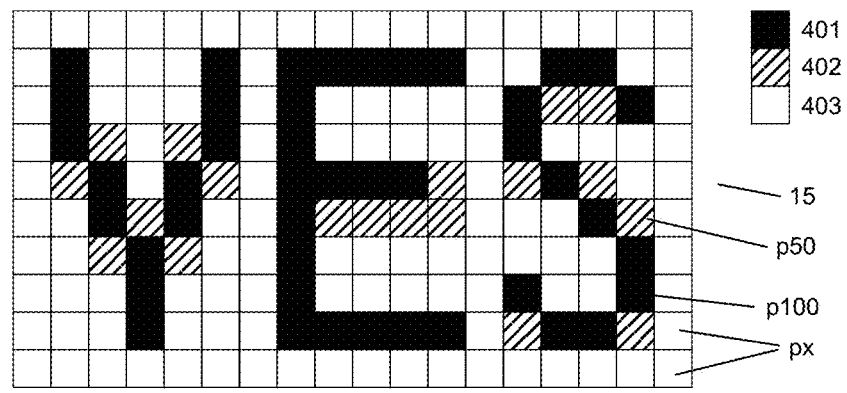
FIG. 4 shows an example of a pixel map of an exemplary pattern to be exposed.

FIG. 4 shows a simple example of an imaged pattern 15 with a size of 10×18=180 pixels, where some pixels p100 of the exposure area are exposed to a gray level 401 of 100% and other pixels p50 are exposed 402 to only 50% of the full gray level. The remaining pixels are exposed to a 0% dose 403 (not exposed at all). Of course, in a realistic application of many embodiments of the invention, the number of pixels of the standard image would be much higher. However, in FIG. 4 the number of pixels is only 180 for the better clarity. Also, in general, much more gray levels will be used within the scale from 0% to 100%.

Oversampling

Figure 3:
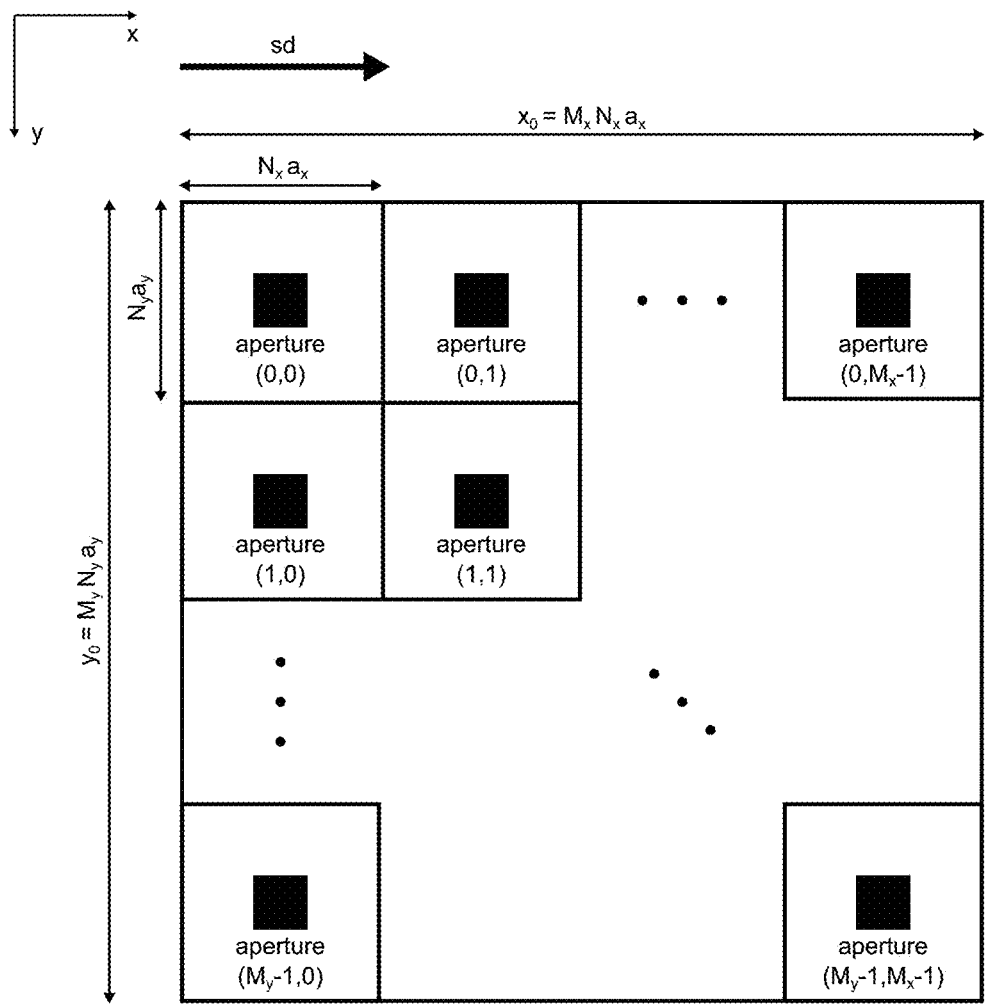
FIG. 3 shows an arrangement of apertures which can be used in certain embodiments of the invention.

FIG. 3 shows the arrangement of primary pixels p1, i.e., IELs that are exposable at one time on the target, according to a basic layout and also illustrates several quantities and abbreviations used in the following. Shown is the arrangement of the aperture images as projected onto the target, forming primary pixels p1, shown in dark shades. The main axes x and y correspond to the direction of advance of the target motion and the perpendicular direction, respectively. Each aperture has widths $a_x$ and $a_y$ along the directions x and y respectively. The apertures are arranged along lines and rows having $M_x$ and $M_y$ apertures, respectively, with the offset between neighboring apertures in a line and row being $N_x$ and $N_y$ respectively. As a consequence, to each aperture belongs a conceptual cell C1 having an area of $N_x a_x N_y a_y$, and the aperture arrangement contains $M_x M_y$ cells arranged in a rectangular way. In the following, these cells C1 are referred to as "exposure cells". The complete aperture arrangement, as projected onto the target, has dimensions of $x_0 = M_x N_x a_x$ by $y_0 = M_y N_y a_y$. In the discussion hereinafter, we will assume a square grid as a special case of a rectangular grid, and set $a = a_x = a_y$, $N = N_x = N_y$ and $M = M_x = M_y$, with M being an integer, for all further explanations without any restriction of the generality. Thus, an "exposure cell" has a size of Na×Na on the target substrate. The distance between two neighboring exposure positions (that is, between pixels) is denoted as e in the following. In general, the distance e can be different from the width a of an aperture image. In the simplest case, a=e, as shown in FIG. 6A for the example of an arrangement of 2×2 exposure cells C3, and one aperture image ai0 (or 'primary pixel' p1) covers (the nominal position of) one pixel. In another interesting case, illustrated in FIG. 6B (and in line with the teachings of U.S. Pat. No. 8,222,621 and U.S. Pat. No. 7,276,714), e can be a fraction a/o of the width a of the aperture image, with o>1 being an integer which we also refer to as the oversampling factor. In this case the aperture images, in the course of the various exposures, will spatially overlap, allowing a higher resolution of the placement of the pattern to be developed. It follows that each image of an aperture will, at one time, cover multiple pixels, namely $o^2$ pixels, and the entire area of the aperture field as imaged to the target will comprise $(NMo)^2$ pixels. From the point of view of placement of aperture image, this oversampling corresponds to a so-called placement grid which is different (since it is finer in spacing) than what would be necessary to simply cover the target area. FIG. 6B illustrates one example of placement grids, in particular the image of an aperture array with an exposure cell C4 having parameters N=2 and M=2 (like in FIG. 6A), as well as an oversampling of o=2. Four aperture images ai1 (dashed lines) are printed on nominal locations being offset from the nominal locations on a regular grid with pitch e in both x and y directions. While the size of the aperture image still is of the same value a, the pitch e of the placement grid is now a/o=a/2. The offset to the previous nominal location (offset of the placement grid) is also of size a/2. At the same time, the dose and/or the gray shade of each pixel may be adapted (reduced), by choosing suitable gray value for the aperture image that cover the respective pixel. As a result, an area of size a is printed but with an enhanced placement accuracy due to the finer placement grid. Direct comparison of FIG. 6B with FIG. 6A shows that locations of aperture images are just arranged on a placement grid twice as fine as before (while the aperture images themselves overlap). The exposure cell C4 now contains $(No)^2$ locations (i.e., "pixels") to be addressed during the write process and thus, by a factor of $o^2$, more pixels than before. Correspondingly, the area ai1 with the size of an aperture image a×a is associated with $o^2$=4 pixels in the case of oversampling with o=2 in FIG. 6B. The following description herein thus relates to the general case of placements grids with arbitrary grid offsets and a pitch of the placement grid being equal or smaller that the size of an aperture image a.

Placement Grid

We now elaborate on the term "placement grid". For this, we first regard the positions of the beamlets on the target, which form a regular array as defined by the aperture array in the PD system. The array of beamlet positions is extended to all sides so as to extend over the entire die area on the target. This gives a regular array of positions which corresponds to the set of pixel positions that can be reached under the condition that the array of beamlets is allowed to move only by grid vectors that correspond to the regular array of beamlets. A "placement grid" is a set of all IELs whose relative positions correspond to such an array. From the above it is obvious that there are $(No)^2$ placement grids (sets of mesh points). Within any area on the target that is within the bounds of the patterned beam pb, it is possible to expose the IELs of a given placement grid simultaneously by the beamlets of the PD system The individual placement grids (or equivalently, the individual pixel positions within a cell) can be labeled by an index g that takes values from 1 to $g_{max}=(No)^2$. Each value of the index g corresponds to one respective placement grid, and by counting through the index g one can cycle through the sequence of different placement grids ("placement grid sequence"). There are $(No)^2!$ different placement grid sequences to choose from.

FIG. 7 illustrates an example of placement grids for the simple case N=2 and o=1. In each cell there are $g_{max}$=4 pixel positions associated with one of placement grids G1, G2, G3, G4, respectively.

Figure 5:
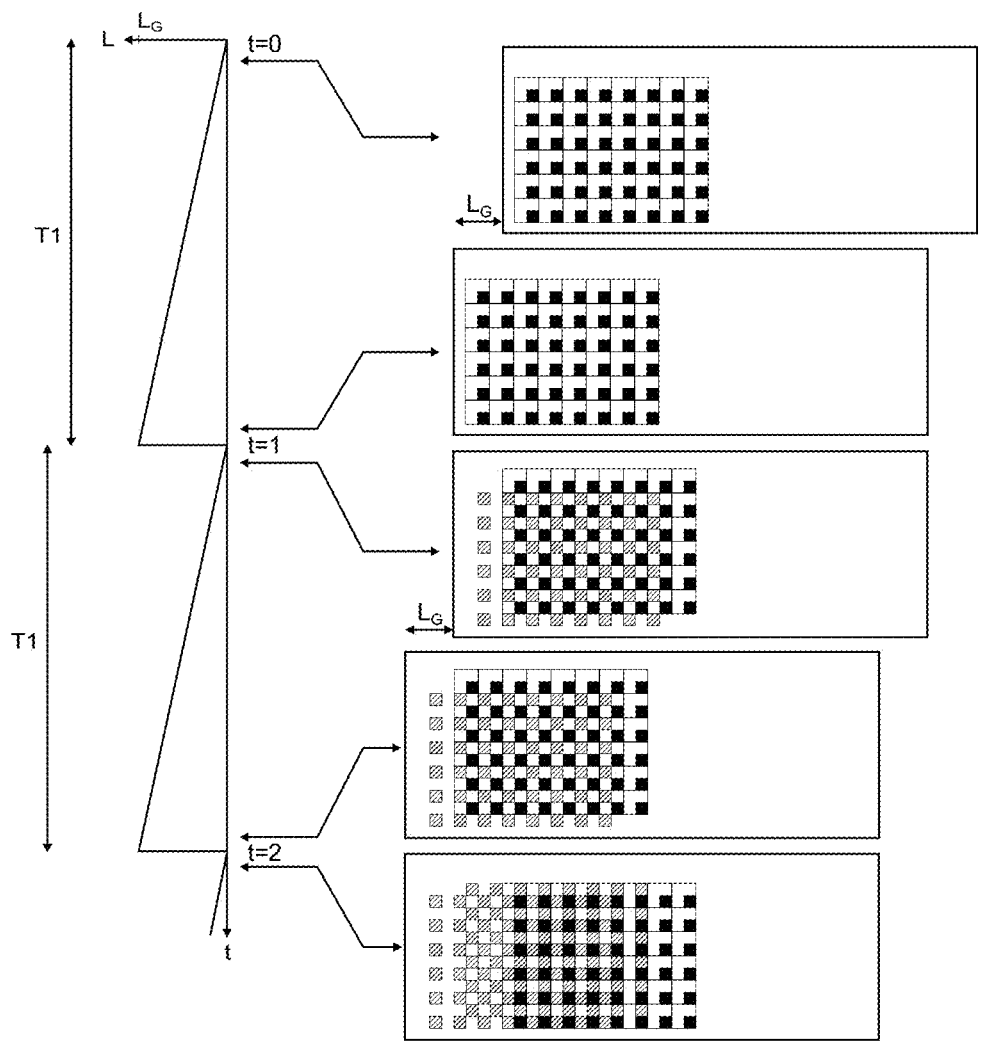
FIG. 5 shows the exposure scheme of the pixel using placement grids.

FIG. 5 shows the exposure scheme of the pixels according to many embodiments of the invention. Shown is a sequence of frames, with increasing time from top (earlier) to bottom (later). The parameter values in this figure are o=1, N=2; also, a rectangular beam array is assumed with $M_x$=8 and $M_y$=6. The target moves continuously to the left, whereas the beam deflection is controlled with a seesaw function as shown on the left side of the figure. During each time interval of length T1, the beam image stays fixed on a position on the target. Thus, the beam image is shown to go through the placement grid sequence P1, P2, P3, P4, P5. Positions P1 to P4 correspond to suitable positions in placement grids G1 to G4, respectively (also see FIG. 8); position P5 represents the start of a new cycle within grid G1, but with an additional longitudinal offset L.

As already mentioned, one cycle of placement grids is exposed within a time interval L/v=NMdv. Therefore, each placement grid takes $1/g_{max}$ of that time interval. This time corresponds to a length by virtue of the target motion, $L_G=vT_1=L/(No)^2=aM/(No)^2$, which we call "exposure length".

Figure 8:
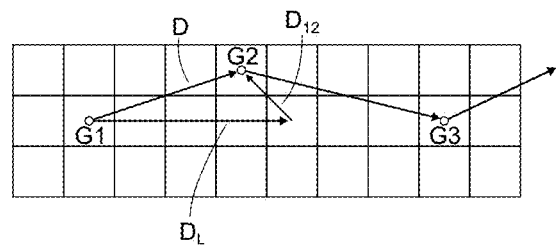
FIG. 8 is a detail with the sequence of placement grids as used in FIG. 5.

The beamlets are moved over the distance of $L_G$ during the exposure of a set of image elements belonging to a given value of the index g together with the target. In other words, all beamlets maintain a fixed position with regard to the surface of the substrate during the time interval T1. After moving the beamlets with the target along a distance $L_G$, the beamlets are relocated instantaneously (within a very short time) to start the exposure of the image elements of the next placement grid, which would have index value g+1 (more accurately, $(g+1) \mod (No)^2$). Referring to FIG. 8, the relocation is composed of a first component $D_L$ along the x direction (this component has length $L_G$, but oriented in the opposite direction) as well as a second component D12 required to switch between the positions of the consecutive placement grids, in the case shown (FIG. 8) placement grids G1 and G2. The main component $D_L$ effectively compensates the movement of the beamlets with respect to the PD device by the distance $L_G$. The second component D12 is the offset between the positions within a cell and can take generally any direction within the x-y-plane, depending on how the exposure positions are located as a function of the index g.

The exposure length $L_G$ is, in general, given by the above formula. Preferably, the values of the parameters M, N and o are chosen such that $L_G$ is an integer multiple of the nominal width a of a pixel. In this case, the second component D12 of the offset between positions is calculated in a straightforward manner from the relative positions of the respective placement grids G1, G2; otherwise, additional corrections to account for the fractional part of $D_L=-L_G$ should be taken into account.

After a full cycle through the placement grids G1 . . . G4, the sequence starts anew. It will be clear from the above and FIGS. 4 and 7, that with the completion of a full cycle of placement grids, the overall displacement is parallel to the x direction (scanning direction) and has an accumulated length of $L=g_{max}L_G$, while the perpendicular components of the individual offsets cancel out mutually.

With this method it is possible to write stripes of arbitrary length, exposing all pixels (IELs) by cycling iteratively through the placement grids. This is equivalent to counting the index g going from 1 to $g_{max}=(No)^2$, and repeat as often as necessary. At the beginning and at the end of the stripe the exposure method may not produce a contiguous covering, so there is a margin mr (FIG. 5) of length L that is not completely filled.

Real-Time Datapath

The vast amount of image data requires a high-speed datapath that generates the pixel data to be exposed in real-time. However, the pattern to be exposed is typically described in a vector format, e.g. as a collection of geometries like rectangles, trapezoids or general polygons, which typically offers better data compaction and therefore reduces the requirements on data storage. The real-time datapath therefore consists of three major parts: a vector-based physical correction process, a rasterization process to translate the vector to pixel data and a buffer to temporarily store the pixel data for the writing process.

Figure 16:
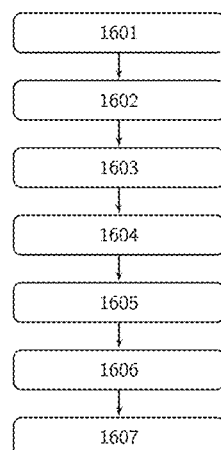
FIG. 16 shows the flow of the real-time datapath.

FIG. 16 shows a flowchart of the datapath, which starts from the pattern to be exposed 1601 being supplied.

Vector-based physical corrections (1602): the pattern to be exposed is split into a large number of small data chunks, possibly with geometric overlaps. Corrections that can be applied in the vector domain like PEC may be carried out to all chunks independently, possibly in parallel, and the resulting data is sorted and coded in a way to improve computation speed of the following steps. The output is a collection of chunks where all chunks contain a collection of geometries. The chunks are sent to the Rasterization process independently.

Rasterization (1603): the geometries of every chunk are converted to a bitmap, where the pixel gray level represents the physical pixel dose. Every pixel that is completely inside a geometry is assigned the color of the polygon, whereas the color of pixels that cross an edge of a geometry is weighed by the fraction of the area of the pixel that is covered by the geometry. This method implies a linear relation between the area of the geometry and the total dose after the rasterization. The doses are first calculated as floating point numbers and are then converted to the discrete set of dose values the apertures support. This dithering process 1605 is a position-dependent rounding process that ensures that rounding errors are averaged over nearby pixels which, combined with oversampling, allows for a much finer dose variation than with the discrete set of dose values available for a single aperture. Finally, the resulting pixel image is compressed and sorted 1606 ("packaging") according to the placement grid sequence and sent to the pixel buffer. Corrections that can be applied in the pixel domain may be carried out before or after dithering depending on the actual correction (e.g. defective apertures correction or compensation of inhomogeneities of the charged particle source).

Defective apertures correction (1604): the correction can be included in the rasterization process as a pixel-based correction. It accounts for apertures that have a fixed dose and compensates by changing the dose of other pixels. The defective apertures correction may be carried out before or after dithering 1605 and packaging 1606 of the image, although a slightly better accuracy is expected if it is done before dithering.

Pixel buffer (1607): the pixel data is buffered until a sufficient amount of data, typically at least the length of a stripe, is present which triggers the exposure of the stripe. The data is taken out of the buffer and applied during the writing process.

Defective Aperture Correction: Principles

The oversampling leads to overlapping aperture images (IELs) and enhances the positioning accuracy of DTC lines. At the same time, the overlap leads to an obvious redundancy because more than one IEL applies electrons to a given point on the substrate. This redundancy can be used to compensate for an always-on or always-off error of an aperture, as described in the following.

The placement grid enhancement of the trotting mode can implement a placement grid sequence where adjacent IELs are not written by the same aperture. For a given PD, the defective apertures can be determined, and the placement grid sequence can be chosen in a way that defective IELs are not adjacent. Defective IELs then overlap only with non-defective IELs, which ensures the abovementioned redundancy.

The method also works for any permutation of the overall placement grid sequence (meaning the totality of all placement grid cycles) because the association between an aperture and the position of its IELs are unchanged. For reasons of simplicity, certain embodiments of the invention are described in the context of a placement grid sequence in accordance with U.S. Pat. No. 8,222,621 without loss of generality.

The goal of the defective aperture correction is to change the dose of the IELs in the vicinity of a defective IEL (precisely: the IELs that have a significant overlap with the defective IEL) so that the error introduced by the defective IEL is compensated as well as possible.

Figure 9:
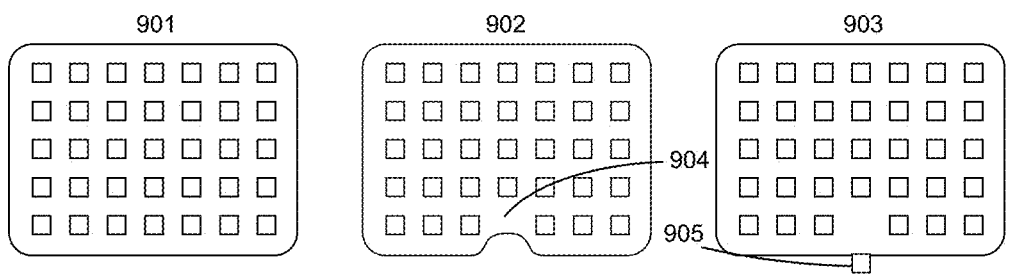
FIG. 9 shows the DTC line correction for an always-off error as suggested in prior art.

In U.S. Pat. No. 8,222,621, and referring to FIG. 9, a method was described where the dose of the IEL 905 next to an always-off defective IEL 904 was increased, for the case of a defective aperture 904 that is located next to a DTC line. This method requires the knowledge and processing of the vector geometry, which is computationally expensive. Also, it does not correct effects of defective aperture images that are not located on the DTC line, and the approach is generally not quantitative.

It should be appreciated that speed is an important feature of the method. The avoidance of the vector geometry as input data, the formulation of the optimization problem in terms of low-dimensional linear algebra problem and a modified and optimized solving algorithm make it possible to implement a real-time correction method.

In the following, the correction for defective IELs is discussed primarily for IELs affected by a defective aperture that is compromised by an always-off or always-on error, which are the major types of defects. Approaches to correction for defective apertures of other types are considered in an extra section.

The most important constraint is the range of possible dose changes to the IELs used for correction, which are called "correction IELs" in the following. A correction IEL is already assigned a dose by the rasterization process, and the minimum and maximum dose restricts the possible dose that can be added or substracted.

To determine the best possible correction, the dose changes are chosen so as to obtain a global dose distribution which is as similar as possible to the desired (unperturbed) dose distribution. This implies a correction of the DTC lines, but the explicit knowledge of the vector geometry is not necessary; the rasterized image carries the information about the unperturbed dose distribution and is used instead. Thus, the speed of the correction algorithm is independent of the complexity of the vector geometry.

This strategy obviously requires the DAC to happen after the rasterization.

Choice of Correction IELs

Figure 10:
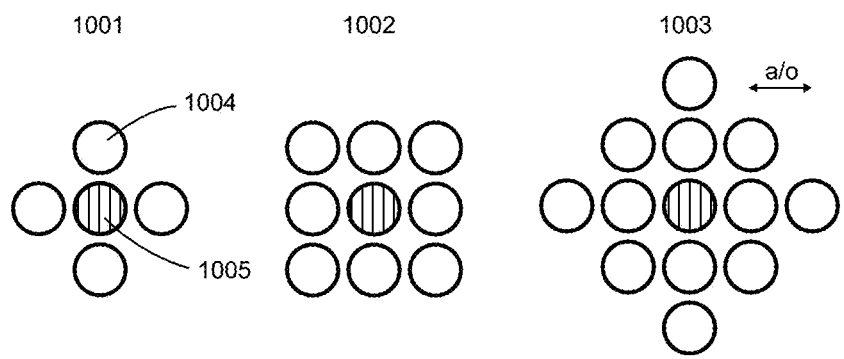
FIG. 10 shows different sets of correction IELs.

The choice of correction IELs determines the speed and quality of the correction. A bigger set enhances its quality and flexibility. Practical choices include 4, 8, 12 or 24 IELs. As illustrative examples FIG. 10 shows three instances of arrangements 1001, 1002, 1003 of respectively 4, 8, and 12 correction IELs (shown as open circles 1004) located around a defective IEL (hatched circle 1005). Note that the depiction in FIG. 10 is simplified; the IELs have a radius of a and are arranged on a grid in a distance of a/o and are actually overlapping, which is not shown in the illustration for the purpose of clarity.

Figure 11:
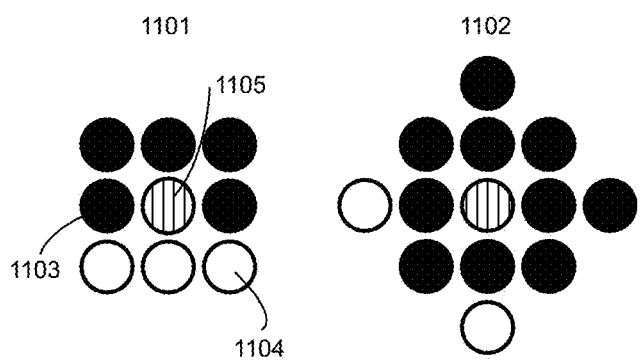
FIG. 11 illustrates the optimization in context of correction IELs at full dose.

FIG. 11 illustrates the importance of a larger set of correction IELs: If some IELs are already at full dose (black circles 1103), they cannot contribute to the correction of the defective IEL 1105, and other IELs can (partly) compensate (white circles 1104). Most importantly, the contour lines are always located at IELs where the dose is not full or zero, and preferably those IELs should also be included if they are not direct neighbors.

Mathematical Formulation

In the following, the correction of a single defective aperture in the context of a rasterized image is described.

The sum of all IELs is a position-dependent electron dose distribution $\Phi(r)$ The IELs are described by $a_i\phi_i(r)$, $i=1\ldots N$; $\phi_i(r)=\phi(r-r_i)$, where $\phi(r)$ is a given IEL distribution function, and $a_i$ are the dose values from the rasterization process. The IELs are arranged on a grid.

$\phi(r)$ is the convolution of the aperture with the (global) point spread function of the optical array. The contour lines (given by the vectors r which solve $\Phi(r)=c$; c being a material-dependent constant) aim to reproduce a given vector geometry. The (non-unique) rasterization process transforms the vector data to amplitudes $a_i$ for the previously mentioned IELs, resulting in a nominal dose distribution $\Phi(r)=\Sigma_i a_i \phi_i(r)$ whose contour lines at c coincide (as well as possible) with the vector geometry. The minimum and maximum dose of each IEL is described as the constraint $0 \le a_i \le 1$ (without loss of generality; any other constant minimum or maximum value could be used instead). The IEL's spatial distribution $\phi_i(r)$ is assumed to be normalized, meaning $\int_{R^2} \phi_i(r)dr=1$.

Each aperture j is responsible for a number of IELs i, which are associated with amplitudes $a_i$. Thus, every defective aperture introduces a set of defective IELs.

The best possible corrected dose distribution $\check{\Phi}(r)=\Sigma_i \tilde{a}_i \phi_i(r)$ is defined by the minimal $L^2$-distance to $\Phi(r)$ ("error functional" E):

$$\min_{\Phi} E = \min_{\Phi} \int_{R^2} (\Phi(r) - \check{\Phi}(r))^2 dr \quad (1)$$

This error functional gives a measure of the deviation of the "corrected" dose distribution, which includes the contributions from the defective IELs and correction IELS, from the nominal dose distribution. The problem includes the total dose distribution $\Phi(r)$, but can be mapped to another formulation including only a small subset of IELs:

$$\Phi(r) = \sum_{i \in U} a_i \varphi_i(r) + a_d \varphi_d(r) + \sum_{i \in C} a_i \varphi_i(r)$$

$$\check{\Phi}(r) = \sum_{i \in U} a_i \varphi_i(r) + \tilde{a}_d \varphi_d(r) + \sum_{i \in C} \tilde{a}_i \varphi_i(r)$$

-continued $$\Phi(r) - \check{\Phi}(r) = (a_d - \tilde{a}_d)\varphi_d(r) + \sum_{i \in C}(a_i - \tilde{a}_i)\varphi_i(r)$$

$$= a\left(\varphi_d(r) - \sum_{i \in C} d_i \varphi_i(r)\right)$$

$$= a\left(\varphi(r) - \sum_{i \in C} d_i \varphi(r - (r_i - r_d))\right).$$

C is the set of indices of all IELs participating in the correction, d is the index of the defective IEL, U is the set of indices of all IELs not participating in the correction, $\tilde{a}_i$ are the corrected amplitudes, $\tilde{a}_d$ is the fixed amplitude of the defective IEL (e.g. 1 or 0; any other value in between is also possible, depending on the type of the defect), $a=(a_d-\tilde{a}_d)$ is the amplitude difference introduced by the defective IEL.

The aim is to find a vector $$d_i = \frac{\tilde{a}_i - a_i}{a_d - \tilde{a}_d}$$

such that the error functional E is minimized:

$$\min_{\Phi} E = \min_{d_i} E = a^2 \min_{d_i} \int_{R^2} \left(\varphi(r) - \sum_{i \in C} d_i \varphi(r - (r_i - r_d))\right)^2 dr.$$

This expression is independent of the existing $a_i$. However, the constraint $0 \le \tilde{a}_i \le 1$ translates to $$\frac{-a_i}{a_d - \tilde{a}_d} \le d_1 \le \frac{1 - a_i}{a_d = \tilde{a}_d} \quad (2)$$

$$u_i \le d_i \le v_i. \quad (3)$$

In the following, we assume $r_d = \vec{0}$ without loss of generality (this is possible through a suitable redefinition of the integration variable r) and omit $a^2$ because it does not influence the vector $d_i$ that leads to the minimal value E. The aforementioned expression can be rewritten as $$\min_{d_i} E = \int_{R^2} \left(\varphi(r) - \sum_{i \in C} d_i \varphi(r - r_i)\right)^2 dr = (S_{ni} d_i - b_n)^2 \quad (4)$$

with $$S_{ni} = \int_{R^2} \phi(r-r_i)\phi(r-r_n)dr \quad (5)$$

$$b_n = \int_{R^2} \phi(r)\phi(r-r_n)dr. \quad (6)$$

As mentioned, these expressions are independent of the actual doses $a_i$ and are calculated beforehand. The doses of the IELs in C (and only those) enter through the constraints.

As mentioned, these expressions are independent of the actual doses $a_i$ and are calculated beforehand. The doses of the IELs in C (and only those) enter through the constraints.

The constrained minimization problem given by Eqs. 2 and 4 and has to be solved for every defective IEL. The result of the optimization $d_i$ is translated to the actual corrected amplitudes $\tilde{a}_i$ using the aforementioned definition of $d_i$:

$$d_i = \frac{\tilde{a}_i - a_i}{a_d - \tilde{a}_d} \quad (7)$$

$$\tilde{a}_i = d_i(a_d - \tilde{a}_d) + a_i \quad (8)$$

Complete Algorithm

Figure 12:
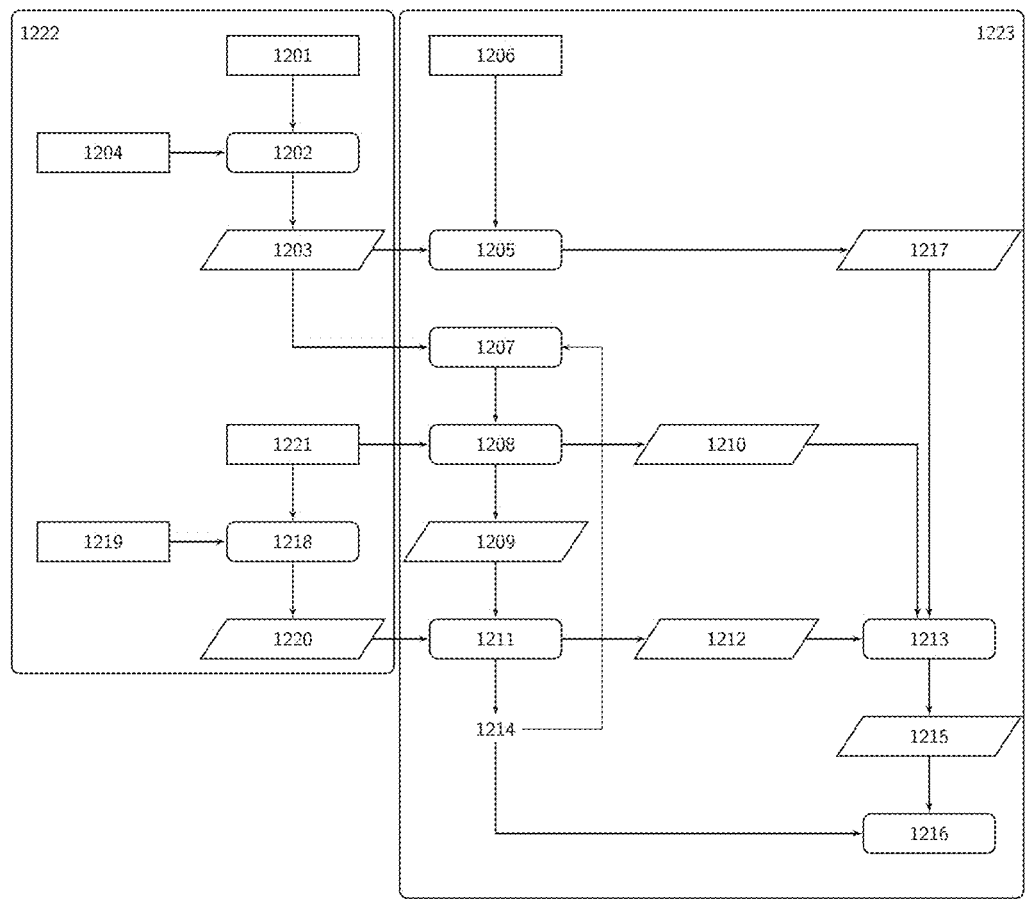
FIG. 12 shows the correction algorithm.

The complete algorithm will be described in reference to the flowchart in FIG. 12.

The algorithm consists of a constant part 1222, which is pre-calculated for a given PD and set of correction IELs, and a variable part 1223, which is executed for every rasterized image.

The constant part 1222 will be described in the following. A list of defective apertures 1201 serves as input. For each defective aperture, the set of defective IELs is calculated 1202 with the help of the placement grid sequence 1204 (each defective aperture writes a multitude of defective IELs, whose position is determined by the placement grid sequence) and appended to a list of all defective IELs 1203. This list contains all IELs that are written with any defective aperture and the type of the error (always-on, always-off, other fixed dose).

The list of relative coordinates of correction IELs 1221 contains the relative coordinates of the IELs that participate in the correction of a defective IEL. FIG. 10 shows three graphic representations for examples of coordinate lists: the first list contains four correction apertures for a defective aperture at the coordinates (x,y) at the coordinates (x+e,y), (x−e,y), (x,y+e) and (x,y−e); the second list contains four additional correction apertures with respect to the first, namely, (x+e, y+e), (x+e, y−e), (x−e, y+e) and (x−e, y−e); the third list contains four additional correction IELs with respect to the second, namely, (x+2e,y), (x−2e,y), (x,y+2e) and (x,y−2e). The list of relative coordinates of correction IELs is used in step 1218 to calculate the overlap matrix S and overlap vector b as "overlap data" 1220 according to Eqs. 5 and 6 (there, the defective IEL is assumed to be at the origin, (x,y)=(0,0), without loss of generality because of the discrete translational symmetry of the grid). The normalized particle density distribution φ(r) of a single IEL 1219 is also needed as an input value to evaluate Eqs. 5 and 6.

The result of the constant part is a list of defective IELs 1203 as well as the matrix S and the vector b of the overlap data 1220 (their dimension equals the length of the list of relative coordinates of correction IELs) according to Eq. 5 and 6.

The variable part 1223 will be described in the following. The non-corrected rasterized IEL dose map 1206 is adjusted in step 1205 according to the list of defective IELs: every IEL associated with a defective IEL is set to the corresponding, erroneous dose, resulting in a IEL dose map with errors 1217. For each defective IEL (loop 1207 to 1214), its corresponding correction IELs 1210 are determined (according to the list of relative coordinates of correction IELs; non-existent correction IELs outside the bounding box of the writing area and correction IELs which are defective themselves must be excluded), and their relative minima and maxima u, v 1209, as described in Eq. 2 and 3, are calculated in step 1208; an optimization algorithm 1211 is used to find the solution d of Eqs. 2 and 4; the solution d 1212 is the change of the correction IELs, which is then added 1213 to the pixels of the rasterized image 1215 corresponding to the correction IELs using Eq. 8. The described process is repeated 1214 for every defective IEL. The resulting corrected dose map 1215 is relayed to the pixel buffer in step 1216.

The optimization algorithm 1211 is preferably a modified and optimized version of the Lawson-Hanson NNLS algorithm which can handle not only non-negative, but also box constraints. Its speed is a crucial feature of the algorithm.

Figure 17:
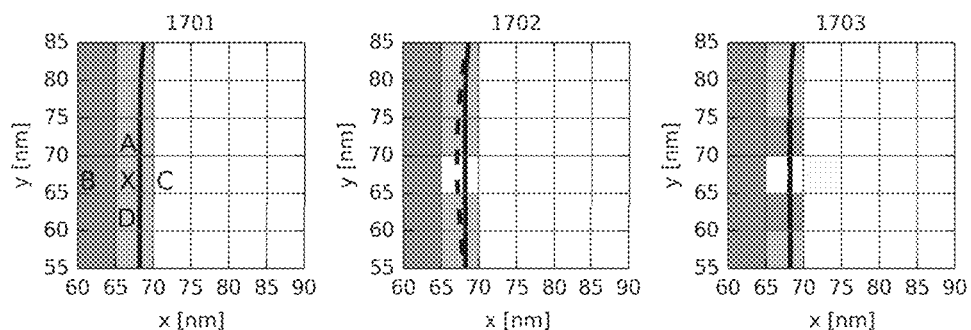
FIG. 17 shows steps of the defective apertures correction method for an always-off error.

Referring to FIG. 17, the procedure of certain embodiments of the invention is illustrated for a 6×6 pixel image detail (o=4) which is a detail of a larger image. The white pixel X in the left-hand view 1701 corresponds to an IEL which is compromised by an always-on error; four correction IELs are used, which are labeled A, B, C and D. The first view 1701 shows the error-free pixels/IEL amplitudes (shades of grey) and DTC line (black). The middle view 1702 shows the erroneous, uncorrected pixels and DTC line (uncompromised: solid, erroneous: dashed). The right-hand view 1703 shows the corrected pixels and DTC line (uncompromised: solid, corrected: dashed), whose generation will be described in detail in the following.

For the sake of simplicity, we assume that, on one hand, N=1.5, which leads to $(No)^2$=36 placement grids (in the case of this 6×6 detail, each placement grid is comprised of one pixel only, and they are numbered from top left to bottom right), and, on the other hand, that the placement grid sequence is linear, so that pixel 1 is written by aperture 1 (note that the geometry and the numbering of the apertures on the PD is not relevant for this example), pixel 2 is written by aperture 2 etc. Because the image detail consists of 36 pixels, every aperture writes one pixel.

The static part, which is independent of the rasterized image, is described in the following. We choose the list of relative coordinates of correction IELs of length 4, as depicted first in FIG. 10. First, we evaluate the matrix S and vector b given by Eq. 5 and 6, using list of coordinates and the IEL dose distribution φ(r) as input. Second, we find all defective IELs using the placement grid sequence and the list of defective apertures. As mentioned, the defective aperture only writes the pixel (labeled X in FIG. 17), so that the list has only one defective IEL, 20, which has an always-on defect.

The variable part, which needs the rasterized image as input, is described in the following.

The rasterized image is given by the values/grey shades of the pixels in frame 1701. According to the list of defective apertures, IEL X (with the correct value $a_d$ of 0.5) has an always-off error, and we set its dose $\tilde{a}_d$ to 0—the result is shown in Fig. frame 1702. This step and the following steps will be performed for every item in the defective IEL list, but are described only once here for the one defective IEL shown.

The concrete four correction IELs are, according to the list of relative coordinates for correction IELs, the IELs A, B, C, D of FIG. 17—their amplitudes $a_i$ are 0.5, 0, 1 and 0.5, respectively. The minimum and maximum constraints u and v for the optimization problem are calculated using Eq. 2 and result in u=(−0.5/0.5,0/0.5, −1/0.5, −0.5/0.5)=(−1,0,−2,−1) and v=((1−0.5)/0.5, (1−0)/0.5, (1−1)/0.5, (1−0.5)/0.5)=(1,2, 0,1). S, b, u and v are the input for the optimization algorithm that simultaneously solves Eq. 3 and 4. It results in the vector d=(0.5,0.01,0,0.5), and through Eq. 8, in the corrected doses $\tilde{a}_i$=$d_i(a_d-\tilde{a}_d)$+$a_i$=(0.5,0.01,0,0.5)0.5+(0.5,1,0,0.5)=(0.75, 0.005,1,0.75) shown in frame 1703 of FIG. 17.

Figure 13:
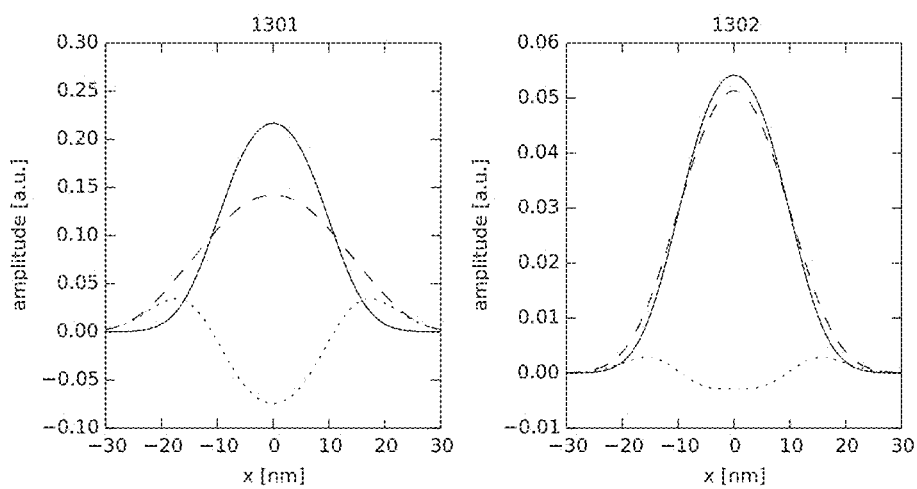
FIG. 13 illustrates the correction of a single IEL for double interlock and quad interlock.

FIG. 13 shows two frames 1301, 1302 illustrating the correction of a single IEL for the case that the correction IELs are not restricted in dose change (double interlock of frame 1301 corresponds to o=2, quad interlock of frame 1302 to o=4). The plots show the nominal dose distribution of the defective always-off IEL (solid), the correction (dashed) and the correction error (dotted).

Figure 14:
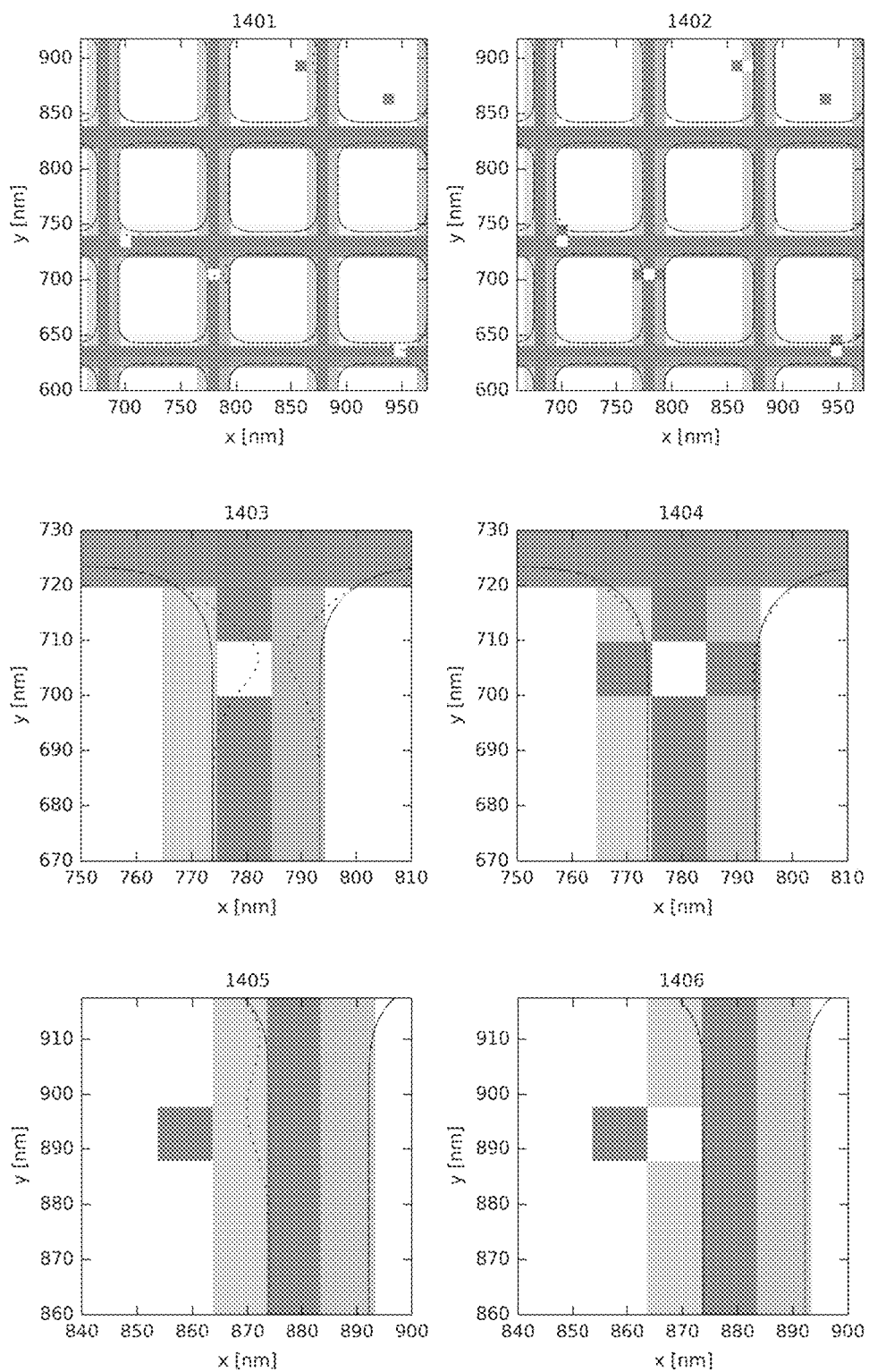
FIG. 14 illustrates the correction using four correction IELs for double interlock.

FIG. 14 shows examples using four correction IELs for double interlock. The left column shows patterns 1401 with defective IELs and enlarged views 1403 and 1405; the dotted line is the DTC generated by the dose distribution that includes defective IELs, which shows significant errors, the solid gray line shows the unperturbed version, and the pixel image represents the IEL doses. The images in the right column 1402, 1404 and 1406 are the corrected patterns with respect to the patterns in the left column 1401, 1403, 1405, respectively. The pixel image illustrates the changes of the IEL doses, and the dotted line shows the corrected dose distribution.

Figure 18:
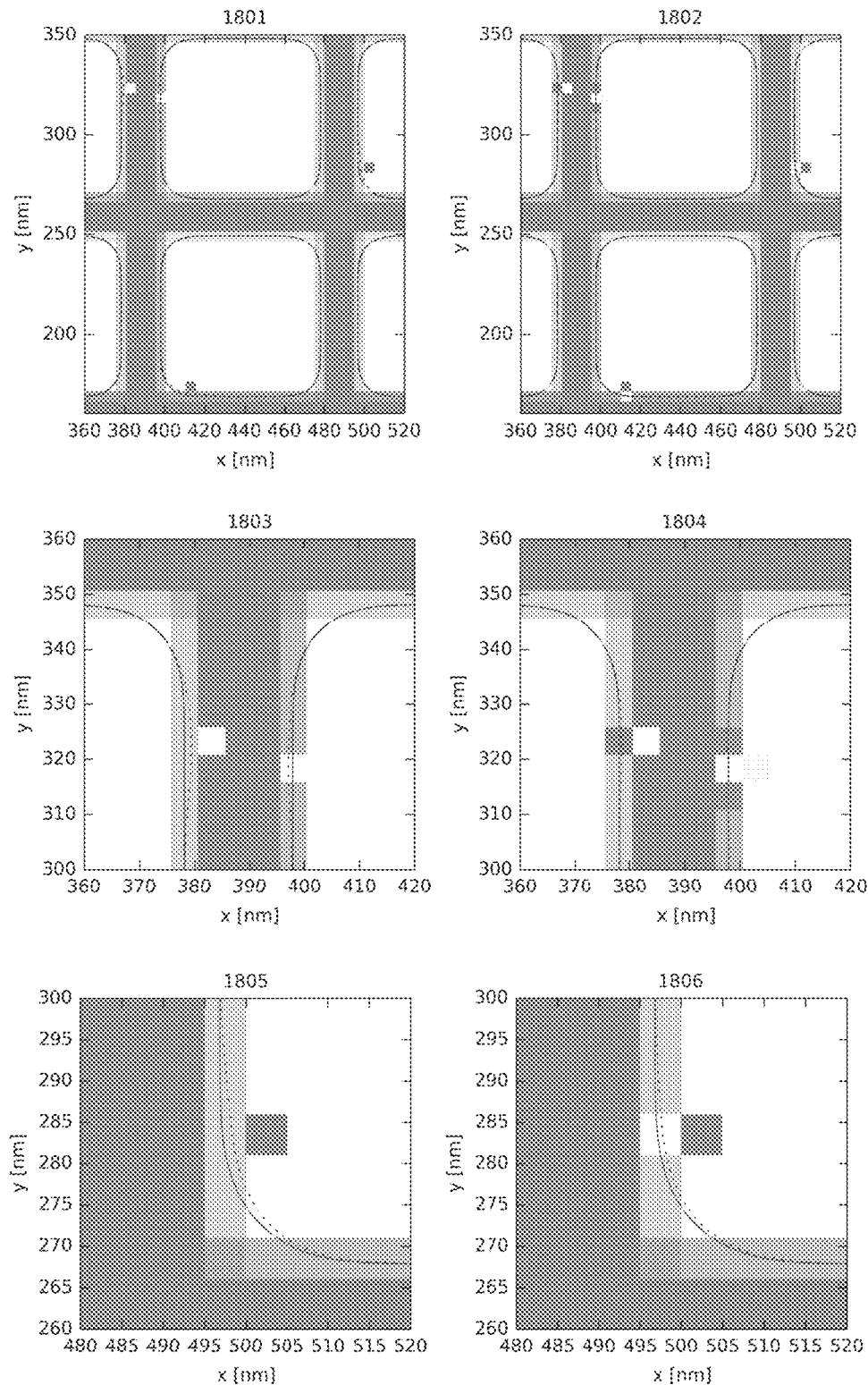
FIG. 18 illustrates the correction using four correction IELs for quad interlock.

FIG. 18 shows six views 1801 1806 in a manner analogous to FIG. 14, but for the case of a quad interlock instead of double interlock.

Figure 15:
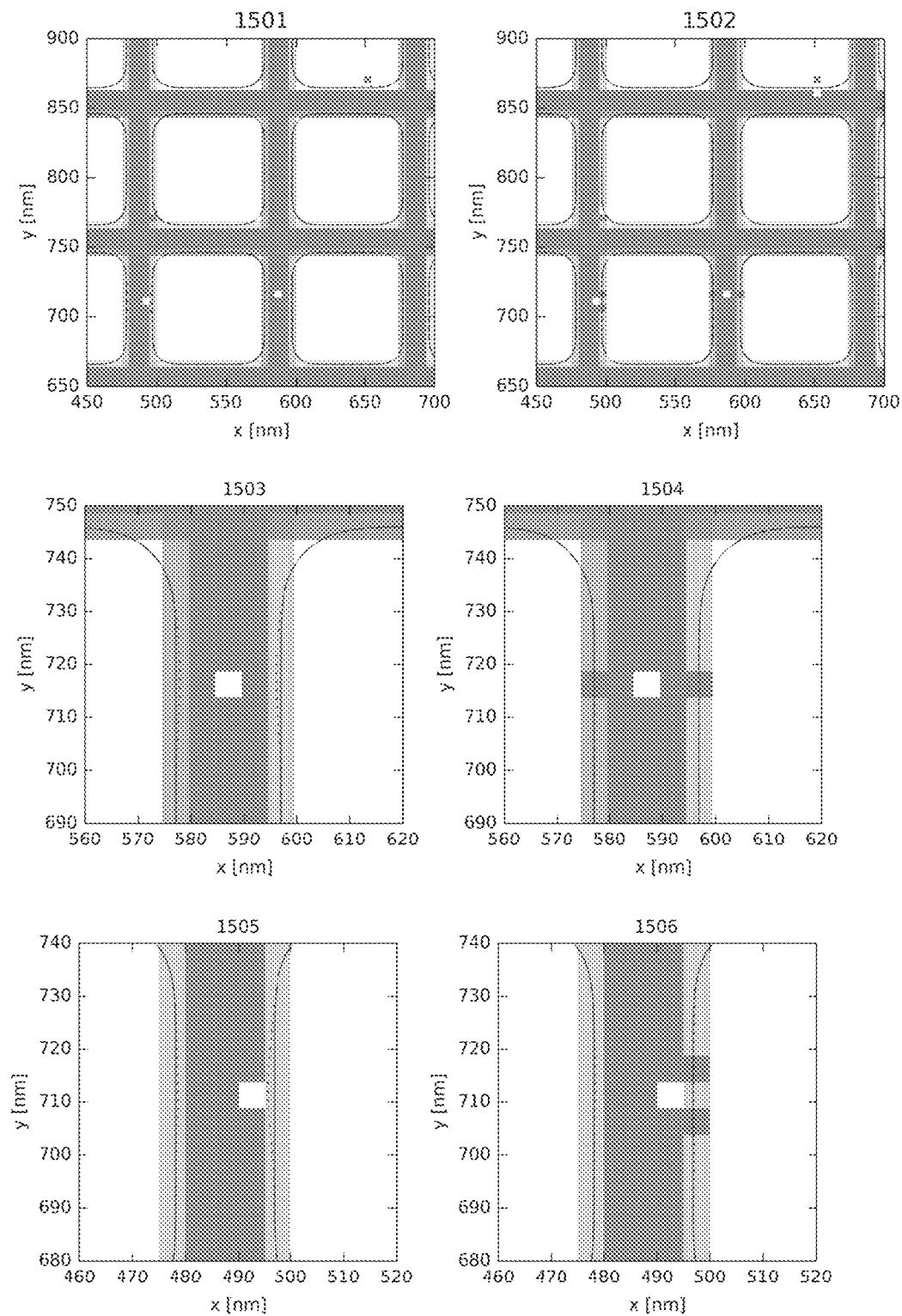
FIG. 15 illustrates the correction using twelve correction IELs for quad interlock.

FIG. 15 shows another six views 1501 1506 illustrating how twelve correction IELs (for quad interlock) can significantly lower the error for defective IELs distant from the DTC line.

Correction of Defective Apertures with Other Defects

An aperture may also be compromised by defects other than a fixed dose or a changed dose range, for instance the aperture image is not on a position on the placement grid or the dose distribution of the aperture image is incorrect. If it is possible to switch off the aperture completely, the aperture can be treated as an aperture with an always-off error.

In a recently filed application (not yet published) of the applicant, aperture images of apertures with always-on errors are physically blocked by a filtering device which is provided in the PD device, effectively converting such always-on apertures to apertures with always-off defects.

Correction of Defective Apertures with a Relative Dose Error

An aperture can be compromised in a way so that all IELs written by that aperture have a relative dose error, meaning that the exposure level of a specific IEL should be E, but is actually a*E (=scaled by a constant factor that is characteristic for the defective aperture). For example, a specific IEL is expected to have an exposure level of E=50%, but because it is written by an aperture that has a relative dose error with a=70%, it actually receives a dose of a*E=50%*70%=35%. This can be corrected by adjusting the expected exposure level E to Ec=E/a. The written exposure level will be Ec*a=E/a*a=E, so that the initially expected dose is re-established. Note that a value of Ec over 100% will be truncated to 100% (=the maximum dose level of the IEL). If the dose change due to the truncation is significant, the IEL can be declared as a defective IEL with a fixed dose error with an expected dose $a_d$=Ec and a fixed dose $\tilde{a}_d$=100%–the defective aperture correction for fixed doses, as described in the previous sections, will then try to compensate the truncation error by increasing the doses of the IELs in the vicinity of the defective IEL.

Additional Correction of Defective Apertures with a Nonzero Fixed Dose

An aperture with a nonzero fixed dose (e.g. with an always-on error) exposes the material even outside the exposure interval, which introduces an antisymmetry between always-on/fixed dose and always-off errors. This phenomenon can be split up in two parts.

First, the aperture image of an always-on aperture exposes the IEL outside the exposure interval while the aperture image remains positioned on an IEL. This can be modeled by setting $$\tilde{a}_d \to \left(1 + \frac{\text{exposure interval}}{\text{remaining interval}}\right)\tilde{a}_d.$$

Second, the beamlet generated by an always-on aperture exposes other parts of the substrate during the beam relocation from one placement grid to an other (as described in the section "placement grids"). All beamlets should be switched off during the relocation, but the always-on beamlets still expose the substrate; typically, this exposure is in the form of lines between the placement grid positions. The relocation vector has a major component in the scanning direction and a minor component in a general direction, and the components perpendicular to the scanning direction of the individual offsets of each relocation cancel out mutually after a full cycle of placement grids. Thus, an always-on aperture exposes the target only within the sector that is written by apertures belonging to the same row in the PD device as the always-on aperture.

A simple way of correction is suggested by substracting a dose B=N*α from every pixel; N is the number of defective always-on apertures in the row of the aperture array to which the aperture that writes the pixel belongs to, and a is a pre-calculated or experimentally determined scaling constant.

The invention claimed is:

1. Method for computing an exposure pattern for exposing a desired pattern on a target by means of a blanking aperture array in a particle-optical lithography apparatus taking into account a finite number of defects in said blanking aperture array, said desired pattern being composed of a multitude of image elements within an image area on the target, wherein the blanking aperture array comprises a plurality of blanking apertures arranged within a blanking array area in a predetermined arrangement defining mutual positions of the blanking apertures, each blanking aperture being selectively adjustable with regard to a dose value to be exposed through the respective blanking aperture onto a corresponding aperture image on the target during a respective exposure interval, said dose value taking a value within a common dose interval between a minimum value and a maximum value, with the exception of a finite number of defective blanking apertures, each defective blanking aperture exposing either a respective constant dose value or a dose interval incompatible with the common dose interval onto a corresponding aperture image on the target during an exposure interval, wherein during a writing process, a sequence of exposure intervals is made, wherein in each exposure interval the blanking apertures are imaged onto the target, thus generating a corresponding plurality of aperture images, wherein the position of aperture images is kept fixed relative to the target during an exposure interval and coincides with the position of an image element, but between exposure intervals the position of aperture images is shifted over the target, thus exposing a plurality of aperture images so as to cover all image elements within said image area on the target, wherein the method comprises:

(a) providing a list of defective blanking apertures, said list comprising information for each defective blanking aperture listed therein, specifying position and either constant dose value or incompatible dose interval of the respective defective blanking aperture, (b) providing the desired pattern and calculating a nominal exposure pattern as a raster graphics defined on the multitude of image elements disregarding the defective blanking apertures, said nominal exposure pattern being suitable to create a nominal dose distribution on the target realizing contour lines of the desired pattern and including for each image element thereof a respective nominal dose value, (c) determining image elements which are exposed by aperture images of defective blanking apertures, referred to as compromised elements, (d) selecting, for each compromised element, a set of image elements, referred to as correction elements, said correction elements being located within a neighborhood of, but different from, the respective compromised element within the image area on the target, (e) calculating, for each compromised element, corrected dose values for the correction elements, said corrected dose values minimizing an error functional of the deviation of the nominal dose distribution from a dose distribution on the target calculated with said corrected dose values, under the constraint that each of the corrected dose values fall within the common dose interval;

(f) generating, from the nominal exposure pattern, a corrected exposure pattern suitable to expose the desired pattern by said writing process by substituting the corrected dose values for the nominal dose values at the respective correction elements.

2. The method of claim 1, wherein step (e) comprises using pre-calculated coefficients which are uniform for all compromised elements, wherein each pre-calculated coefficient of a first group is an integrated overlap between a compromised element and a respective correction element of the pertinent set of correction elements, and each pre-calculated coefficient of a second group is an integrated mutual overlap between two correction elements within a set of correction elements.

3. The method of claim 1, wherein in step (d) the correction elements are chosen from one of: the set of nearest neighbors to the respective compromised element, the set of neighbors to the respective compromised element up to a predetermined maximum distance; where the distance is measured using one of: Euclidean, rectilinear or p-norm distance.

4. The method of claim 1, wherein for defective elements caused by a defective blanking aperture having a defect where the defective blanking aperture exposes a respective constant value, before step (e) the respective dose value is additionally increased by multiplication with a factor corresponding to the quotient of the duration of one exposure interval to the duration during which an aperture image remains positioned on an image element.

5. The method of claim 1, wherein for defective elements caused by a defective blanking aperture having a defect different from a defect where the defective blanking aperture exposes either a respective constant dose value or a dose interval incompatible with the common dose interval, the defect is treated as always-off defect with the respective blanking aperture being operated at the minimum value of the dose interval.

6. The method of claim 1, wherein the error function as used in step (e) is a least-squares error functional of the deviation, and calculating corrected dose values comprises solving for a minimum of said error function using a box-constrained least-squares algorithm, preferably with a dimensionality equal to the number of correction elements within the respective set.

7. The method of claim 1, wherein step (d) is performed using a uniform geometry of the set of correction elements relative to the position of the respective compromised element.

8. The method of claim 1, wherein before step (e) for defective elements caused by a defective blanking aperture having a relative-dose defect, which causes the exposure of a dose value which differs from the value assigned to the respective blanking aperture by a multiplicative factor individual to the blanking aperture, the dose values of the defective blanking aperture are multiplied with the inverse of said constant factor, and if the dose value thus obtained exceeds the maximal value of the common dose interval, the respective defective blanking aperture is treated as having an always-on defect.

9. The method of claim 1, wherein between exposure intervals the position of aperture images is shifted over the target according to a placement grid sequence, wherein in step (d) a placement grid sequence is selected with regard to a geometry of the set of correction elements relative to the position of the respective compromised element, where said placement grid sequence and said geometry ensure that for any compromised element the respective set does not include image elements exposed by a defective blanking aperture.

10. Method for exposing a desired pattern on a target by means of a blanking aperture array in a particle-optical lithography apparatus taking into account a finite number of defects in said blanking aperture array, said desired pattern being composed of a multitude of image elements within an image area on the target, wherein the blanking aperture array is illuminated with a beam of electrically charged particles, the blanking aperture array comprising a plurality of blanking apertures arranged within a blanking array area in a predetermined arrangement defining mutual positions of the blanking apertures, and images of at least part of said blanking apertures are imaged onto the image area on the target, wherein each blanking aperture is selectively adjustable with regard to a dose value to be exposed through the respective blanking aperture onto a corresponding aperture image on the target during a respective exposure interval, said dose value taking a value within a common dose interval between a minimum value and a maximum value, with the exception of a finite number of defective blanking apertures, each defective blanking aperture exposing a respective constant dose value onto a corresponding aperture image on the target during an exposure interval, wherein during a writing process, a sequence of exposure intervals is made, wherein in each exposure interval the blanking apertures are imaged onto the target, thus generating a corresponding plurality of aperture images, wherein the position of aperture images is kept fixed relative to the target during an exposure interval and coincides with the position of an image element, but between exposure intervals the position of aperture images is shifted over the target, thus exposing a plurality of aperture images so as to cover all image elements within said image area on the target, wherein the exposure pattern for exposing the desired pattern on the target by said writing process, said exposure pattern comprising the dose values for the blanking apertures for each exposure interval, is computed by the method of any of the preceding claims.

* * * * *

UNITED STATES PATENT AND TRADEMARK OFFICE
CERTIFICATE OF CORRECTION

PATENT NO. : 9,269,543 B2  
APPLICATION NO. : 14/631690  
DATED : February 23, 2016  
INVENTOR(S) : Rafael Reiter, Elmar Platzgummer and Klaus Schiessl Page 1 of 1

It is certified that error appears in the above-identified patent and that said Letters Patent is hereby corrected as shown below:

Title page, item (72) Inventors: Change "Schiessel" to --Schiessl--.

Signed and Sealed this
Third Day of May, 2016

Michelle K. Lee
*Director of the United States Patent and Trademark Office*